(12) United States Patent
Deppe et al.

(10) Patent No.: US 6,370,179 B1
(45) Date of Patent: Apr. 9, 2002

(54) LOW THRESHOLD MICROCAVITY LIGHT EMITTER

(75) Inventors: Dennis G. Deppe; Diana L. Huffaker, both of Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 09/068,591

(22) PCT Filed: Nov. 12, 1996

(86) PCT No.: PCT/US96/18194

§ 371 Date: Dec. 28, 1998

§ 102(e) Date: Dec. 28, 1998

(87) PCT Pub. No.: WO97/18581

PCT Pub. Date: May 22, 1997

(51) Int. Cl.[7] .............................. H01S 5/10; H01S 5/183
(52) U.S. Cl. ............................................. 372/96; 372/45
(58) Field of Search .............................. 372/45, 46, 49, 372/96

(56) References Cited

U.S. PATENT DOCUMENTS

| 5,266,503 A | 11/1993 | Wang et al. ............... 438/42 |
| 5,316,968 A | 5/1994 | Choquette ................. 438/39 |
| 5,359,447 A | 10/1994 | Hahn et al. ............... 359/154 |
| 5,400,354 A | 3/1995 | Ludowise et al. .......... 372/46 |
| 5,491,712 A | 2/1996 | Lin et al. ................... 372/50 |
| 5,493,577 A | 2/1996 | Choquette et al. ......... 372/46 |
| 5,517,039 A | 5/1996 | Holonyak, Jr. et al. ..... 257/94 |
| 5,550,081 A | 8/1996 | Holonyak, Jr. et al. ..... 437/129 |
| 5,568,499 A | 10/1996 | Lear ........................... 372/45 |
| 5,596,595 A | 1/1997 | Tan et al. ................... 372/96 |
| 6,194,254 B1 * | 2/2001 | Takemura ................. 438/166 |

FOREIGN PATENT DOCUMENTS

| JP | 4-42589 | 2/1992 |
| JP | 6-196804 | 7/1994 |
| JP | 6-232494 | 8/1994 |

OTHER PUBLICATIONS

International Search Report dated Mar. 4, 1997 (PCT/US96/18194) (UTFB:619P).

* cited by examiner

Primary Examiner—James W. Davie
(74) Attorney, Agent, or Firm—Fulbright & Jaworski

(57) ABSTRACT

Disclosed is a low threshold vertical cavity surface emitter having a low refraction index confining layer (36) directly in the cavity spacer. This allows a ½ wavelength cavity spacer and lateral size of as low as 2 μm. Also disclosed is a method of rapid temperature annealing to seal a III-V crystal and inhibit oxidative degradation.

11 Claims, 19 Drawing Sheets

LOW THRESHOLD MICROCAVITY LIGHT EMITTER

BACKGROUND OF THE INVENTION

Field of the Invention

The present invention relates generally to the field of semiconductor light emitters and more particularly to the field of vertical cavity surface emitters, including lasers.

BACKGROUND OF THE INVENTION

A goal of the semiconductor industry is to fabricate light emitting devices for use in either optical fiber or free space optical interconnects. For such applications a benefit in the optical interconnect complexity is derived with the use of light emitting devices such as semiconductor lasers or spontaneous light emitting diodes which operate with both high power conversion efficiency and minimal input power thus allowing a large number of individual semiconductor light emitters to act as signal transmitters for a given total input power. For these semiconductor light emitters, a challenge is to realize a small volume region which highly confines both injected electrical charge carriers as well as the internal optical mode. This small volume then minimizes the input electrical power required to achieve lasing threshold, and leads to cavity controlled spontaneous emission in a light emitting diode and improved power conversion efficiency. In the vertical cavity surface emitting laser (Jewell et al., 1991) and the resonant cavity light emitting diode (Deppe et al., 1990; Schubert et al., 1994) both the optical mode and the injected charge carriers are highly confined in only the normal direction of the cavity. Both types of devices are based generally on short, planar semiconductor Fabry-Perot cavities fabricated through epitaxial crystal growth in the normal direction to the crystal surface. The length dimension in the normal direction to the cavity which establishes the length of the optical mode can be controlled only to a length of one or several emission wavelengths (on the order of microns), while the charge carriers in the cavity normal direction are confined to dimensions of hundreds of angstroms through the use of heterojunction quantum wells.

For the resonant cavity light emitting diode, in controlling the length of such cavities one can also control the spontaneous emission from the injected charge carriers. Following the work of Drexhage (Drexhage. 1974), it has been shown that the collection efficiency and speed of light emitting diodes can be increased through planar optical confinement (Deppe et al., 1990, NeNeeve et al., 1995; Huffaker and Lin et al., 1995). However, the planar Fabry-Perot cavity is limited by its weak lateral confinement in controlling spontaneous emission. If an attempt is made to reduce the lateral size of the planar cavity device to less than a dimension characteristic of the vertical loss rate of the cavity, the resulting optical mode internal to the laser cavity will suffer high diffraction loss, and therefore loss of lateral optical confinement, resulting in both an increased input power requirement and a reduced power conversion efficiency. For vertical cavity surface emitting lasers of AlGaAs/GaAs/InGaAs materials and previous planar designs the characteristic limiting lateral dimension is an 8 to 10 µm optical mode diameter.

One possible solution to reduce the lateral size of the vertical cavity surface emitting laser is to etch the lateral dimension into the shape of a pillar, therefore relying on the large lateral index change from the semiconductor to air to confine the optical mode (Jewell et al., 1991). Such pillar shaped vertical cavity surface emitting lasers suffer both carrier losses due to high recombination rates at the damaged semiconductor surfaces as well as high optical scattering losses. In addition, a second serious difficulty with this type of device is the exposed AlAs or AlGaAs material left at the crystal surface. The AlGaAs is unstable in the oxygen rich room ambient and decomposes in times ranging from minutes to days or weeks, depending on the layer thicknesses and Al composition. Therefore, without a protective coating to effectively seal the AlGaAs material this type of device is inherently unreliable.

If only the electrical current and charge carriers are confined, the lateral dimension of the optical mode cannot be reduced beyond that characteristic of the vertical cavity design without suffering high diffraction loss, and therefore increased power consumption and reduced power conversion efficiency, as stated above. One such attempt to control only the current is a vertical cavity surface emitting laser described in U.S. Pat. No. 5,359,618 (Lebby et al., 1993) in which the second or upper mirror consisting of an AlAs/GaAs Bragg reflector is formed into a mesa, and a portion of the layers of the mesa adjacent the exposed outer walls has a reduced electrical conductance through either selective oxidation of the AlAs layers achieved by applying a wet ambient to the mesa at a temperature of 400° C. or alternatively through selective etching of AlAs layers of the Bragg reflector. This process funnels current into the VCSEL active region and improves electrical efficiency. The device design described in U.S. Pat. No. 5,359,618, however, takes little advantage of controlling the optical mode, as only layers removed from the center of the cavity (in the upper portion of the Bragg relector) are either wet etched or selectively oxidized. If multiple layers of the mirror are oxidized or wet etched optical scattering loss will again limit device performance in similarity to the etched pillar design. If the lateral dimension of such a device is reduced to too small a value (less than or about 8 to 10 µm) without proper placement of the oxide layers, diffraction and scattering loss will increase the threshold drive current. In addition, if selective etching is used to remove a portion of the upper mirror and thus form the current funneling electrical path, AlAs layers will be left exposed at the crystal surfaces of the device. As with the etched pillar of Jewell et al., 1990, unless treated to reduce their reactivity with an oxygen containing ambient, these exposed AlAs layers will decompose in the typical room air environment into undesirable oxide compounds and lead to rapid device failure. Also to date, wet etching of selected layers of the Bragg reflector has not resulted in improved device performance because of inherent mechanical instability of the remaining multiple thin layers. The wet etched device of U.S. Pat. 5,359,618 is therefore impractical.

There are therefore two serious problems facing the lateral size reduction of an AlAs (AlGaAs)/GaAs/InGaAs vertical cavity surface emitter to reduce the device power consumption and improve operating efficiency. The first being achieving a small area low loss optical mode within the cavity, and the second being the chemical instability of any exposed AlAs (or high Al composition $Al_xGa_{1-x}As$, $x \geq 0.6$) which might remain at the device surface due to the device fabrication. If left unprotected, the exposed AlAs (or AlGaAs) will decompose over times of hours, days, weeks, or years, into various porous oxides thus leading to device failure (Dallesasse et al., 1990).

One such possible treatment of an exposed AlAs or AlGaAs is the steam oxidation as described in U.S. Pat. No. 5,262,360 of Holonyak and Dallesasse, and also in the laser device of U.S. Pat. No. 5,359,618 of Lebby et al. with reduced electrical conductance. The oxide described is formed by exposing an AlAs surface to a water vapor containing ambient (steam) at the elevated temperature range of 400 to 500° C. This oxide formed by steam oxidation of AlGaAs is useful in forming low refractive index layers buried within an epitaxial AlGaAs/GaAs heterostructure as the oxidation proceeds at a very high rate, and to achieve lateral optical confinement within a semiconductor cavity. However, as a surface passivation layer the oxide formed by steam oxidation also has undesirable characteristics due to its thickness (typically greater than several microns) and strain created within the semiconductor device. Upon subsequent thermal cycling such as might occur in typical semiconductor processing (for example, metal contact annealing) the oxide formed by steam oxidation can crack the semiconductor and lead to device failure. In addition, the strain due to the thick oxide formed by steam oxidation can lead to device failure over long term operation. Controllable thin oxides formed by the steam oxidation, on the other hand, are difficult to achieve due to the high oxidation rate and the necessity to oxidize at temperatures greater than about 400° C. (U.S. Pat. No. 5,262,360). Therefore, for very small AlAs/GaAs devices in which the AlAs semiconductor might form an exposed surface it is desirable to have an alternative method by which the AlAs crystal surface may be effectively sealed against further decomposition due to oxygen exposure.

It is highly desirable then to achieve the simultaneous confinement of both the electrical charge carriers and the optical mode of a vertical cavity surface emitting laser or light emitting diode to a small area, low loss optical mode, and therefore greatly reduce the power consumption as well as improve power conversion efficiency. Furthermore, since the processing of such small layered semiconductor structures of AlAs/AlGaAs/GaAs/InGaAs often involves exposing AlAs or AlGaAs surfaces which then decompose in the room ambient, a means of sealing an exposed AlAs or AlGaAs surface against oxidative decomposition which is compatible with the semiconductor processing is also highly desired.

SUMMARY OF THE INVENTION

It is a purpose of the present invention to provide a vertical cavity surface emitter wherein the spacer layer separating two cavity reflectors contains both internal optical and electrical confinement to achieve strong light confinement to a small area, low loss optical mode. While previous teachings suggest that the strong optical confinement need be achieved along the full length of the laser cavity (Jewell et al., 1991; Numai et al., 1993), a discovery of the present invention is that index confinement is optimally placed within the laser cavity spacer layer of the otherwise planar cavity to greatly reduce lateral diffraction loss but without the increase of optical scattering loss due to sidewall roughness or multiple apertures, and achieve a small area, low loss optical mode. In addition, by retaining a planar cavity a low electrical conductivity contact is made to the cavity, and both high electrical current injection efficiency and high optical mode confinement is readily achieved. Furthermore, for the vertical cavity surface emitting laser the index confinement is optimally placed within a lateral dimension characteristic of the vertical cavity design for laser operation, and more optimally within a lateral dimension characteristic of the coherence of the spontaneous emission from the electrical semiconductor charge carriers of electrons and holes. For present day AlAs/GaAs/InGaAs semiconductor light emitters, these lateral dimensions are less than 10 $\mu$m and easily reach 2 $\mu$m in diameter. Using such designs the present inventors have substantially reduced the required threshold drive level of a vertical cavity surface emitting laser over that of prior art in which threshold drive currents were typically greater than 0.5 mA, and more often greater than 2 mA, to less than 0.1 mA with room temperature operation. The low refraction index layer allows the lateral size reduction of the optical mode below that characteristic of the otherwise planar vertical cavity design, while maintaining low diffraction loss. The low refraction layer is also designed as electrically insulating so that electrical current is confined to the small light emitting area. Ultra low power operation of a semiconductor laser with high power conversion efficiency then becomes possible because of the very small and low loss optical volume. For the purpose of a spontaneous light emitting diode with controlled spontaneous emission, a discovery of the present invention is that the lateral index confinement within the cavity spacer can lead to controlled spontaneous emission into a single optical mode of the cavity, with the result of spontaneous angular narrowing in the radiated far-field. It is understood that the present disclosure is applicable to any group III-V crystal as that is understood in the art and that AlAs/GaAs/InGaAs/AlGaAs are used by way of example only.

Disclosed herein are small area half-wave cavity VCSELs with single QW active regions defined using the native-oxide process (Huffaker, Deppe, et al., 1994; Deppe et al., 1994). For the half-wave VCSEL the native-oxide can be formed very close to the active region, and the present disclosure demonstrates a 2 $\mu$m laser in which the oxide is only 200 Å from the QW. A CW room-temperature lasing threshold current of 91 $\mu$A is achieved.

The present invention may be described in certain embodiments as a vertical cavity surface emitter comprising a cavity spacer, wherein a low refraction index confining layer is built directly into, or is contained in the cavity spacer, so that a single or multiple QW active region can be placed in very close proximity to the low index layer (within one-fourth of an optical wavelength). The low refraction index confining layer is preferably in the upper part of the cavity spacer, but may also be in the lower part, or both. The cavity spacer may be a full wavelength spacer or may be more preferably a ½ wavelength spacer. A wavelength of ½ wavelength spacer is understood to mean the vertical dimension of the spacer is equal to the size of one wavelength or ½ wavelength, respectively of the emitted light. The cavity spacer is adjusted in thickness so as to achieve a spectral resonance between a semiconductor light emitting region and adjacent cavity reflectors, as is typical with a full wavelength cavity spacer or more preferably a ½ wavelength spacer. Within such an otherwise planar cavity, an optical mode will occur representing the lowest loss mode of the cavity. The lateral size of this lowest loss optical mode will be set by lateral diffraction of the field within the cavity, and is due to both the cavity spacer thickness and any field penetration into the mirrors, and the number of round trips within the cavity. Ujihara has derived the approximate expression for this lateral mode area given by $A \sim \lambda \cdot L/(1-R)$ where $\lambda$ is the resonant wavelength within the cavity spacer material, L is the effective length of the total cavity including field penetration into distributed mirrors, and R is the mirror reflectivity product, square root $R_1 R_2$ of the two cavity mirrors. A significant difficulty in fabricating small area vertical-cavity surface-emitters is the rapid increase in diffraction loss if an active area is reduced to less than the size of A. On the other hand, this diffraction loss can be controlled through the introduction of the low refraction index layer directly into the cavity spacer and within the mode area A of the otherwise planar cavity, with the result of controlling both the lateral diffraction loss and the lateral mode size. Typical dimensions of present day lateral mode sizes in semiconductor vertical cavity surface emitting lasers (VCSELs) based on AlAs/GaAs semiconductors is ~6–10 $\mu$m diameter. A certain embodiment described herein has reduced this mode size to <2 $\mu$m diameter. Scaling the threshold current with device area allows a 25-fold reduction in a required lasing threshold drive current in the mode size reduction from 10 to 2 $\mu$m.

For VCSELs, the benefit of index-guiding in reducing optical mode loss is a significant improvement in the field, as most previous attempts have been directed toward etching of small diameter (<8 $\mu$m) cylindrical pillars to take advantage of the large semiconductor-air index change (Jewell et al., 1991). Such attempts have so far met with only limited success due to both carrier and scattering losses on the VCSEL sidewalls, and threshold currents are typically greater than 0.5 mA. Also, because such devices are typically realized from the AlAs/GaAs semiconductor and possess exposed AlAs surfaces, they can prove unreliable due to AlAs degradation in the atmospheric environment.

The low refraction index confining layer of the present invention may be a native aluminum oxide, and more particularly, may be $Al_xO_y$, where x is preferably=2 and y is preferably=3. In certain embodiments, the $Al_xO_y$ is prepared by selective conversion of AlAs or AlGaAs using a steam oxidation at elevated temperatures of 400 to 500° C. However, it is understood that the low refractive index layer may be prepared by other means such as chemical vapor deposition, electron beam deposition, sputtering, or other oxidation technique.

In the present invention, the low refraction index confining layer may also be an etched void. Etched voids present an added difficulty due to the chemical instability of any exposed AlAs layers. Such layers will degrade in the atmospheric environment with the result of early device failure. If an etched void is used, or if any exposed AlAs occurs on a device surface, the present discovery enables one to seal the surface against further decomposition, by subjecting the AlAs surface to a rapid temperature anneal (RTA) in an inert gas containing a small percentage (less than or ~10%) of $O_2$, where the inert gas may be nitrogen or argon or an inert gas with ~10% $H_2$ v/v at a higher temperature than one would normally use for the wet oxidation described above. For example, the RTA may be performed at a temperature of from about 400 to about 1000° C. or at a temperature of from about 500 to about 600° C. or even at a temperature of from about 525 to about 550° C. The present disclosure demonstrates that the anneal may be performed for a time as brief as from 5 seconds to 10 minutes, or for a period of from about 5 seconds to 1 minute or for a period of from about 15 seconds to about 45 seconds or even for a period of about 30 seconds. The basis of the sealing of the AlAs surface is the self-terminating conversion of porous oxides formed at room temperature to a thin, dense protective oxide which is impermeable to further oxidative decomposition. The oxide formed by the RTA is a distinct material from that formed by the wet oxidation as described in U.S. Pat. No. 5,262,360 of Holonyak and Dallesasse. The higher temperature RTA formed surface oxide blocks further wet oxidation, making it useful as a mask of the wet oxidation. The practice of this embodiment of the present invention is of benefit in device processing by blocking subsequent steam oxidation and certain wet etches of AlAs. Although the AlAs or AlGaAs that is annealed by the present method is slightly oxidized by exposure to normal atmosphere, the rapid temperature anneal forms a dense structure that inhibits further oxidation.

In certain embodiments, the devices of the present invention will employ native oxides or etched voids, and will require subsequent steam oxidation or selective etching. The RTA oxide of the present invention will find utility as a mask for either subsequent steam oxidations or selective etches of such devices due to the greatly reduced HCl etch rate of RTA sealed AlAs surfaces compared to non-sealed surfaces. Since, in the device processing steps many AlAs layers might be exposed in which selective conversion to $Al_xO_y$ due to steam oxidation is undesirable, the RTA sealing oxide can be formed first on these layers preventing their further conversion. In this manner a native oxide can be formed only in the VCSEL cavity or other desired AlAs layers, while the sealed AlAs surfaces remain intact.

In certain embodiments, the invention may be described as a vertical cavity surface emitter comprising a distributed Bragg reflector composed of layers of n-type AlAs and n-type GaAs and forming the bottom of the vertical cavity surface emitter, a second distributed Bragg reflector composed of layers of p-type GaAs and forming the top of the vertical cavity surface emitter, a spacer cavity of one-half wavelength vertical dimension between the distributed Bragg reflectors and a low refractive index layer is within the spacer cavity. The low refractive index layer may preferably be an $Al_xO_y$ layer and may be formed by selective conversion of AlAs or AlGaAs, or alternatively, the low refractive index layer may be an etched void and the void may be sealed by a rapid thermal anneal.

BRIEF DESCRIPTION OF THE DRAWINGS

FIG. 14A, annealing at 500° C. 30 s. FIG. 14B, no annealing.

FIG. 15A. mesa edge. FIG. 15B, mesa center, single arrow QW's. double arrow. Al$_x$O$_y$.

DETAILED DESCRIPTION OF THE PREFERRED EMBODIMENTS

Figure 1:
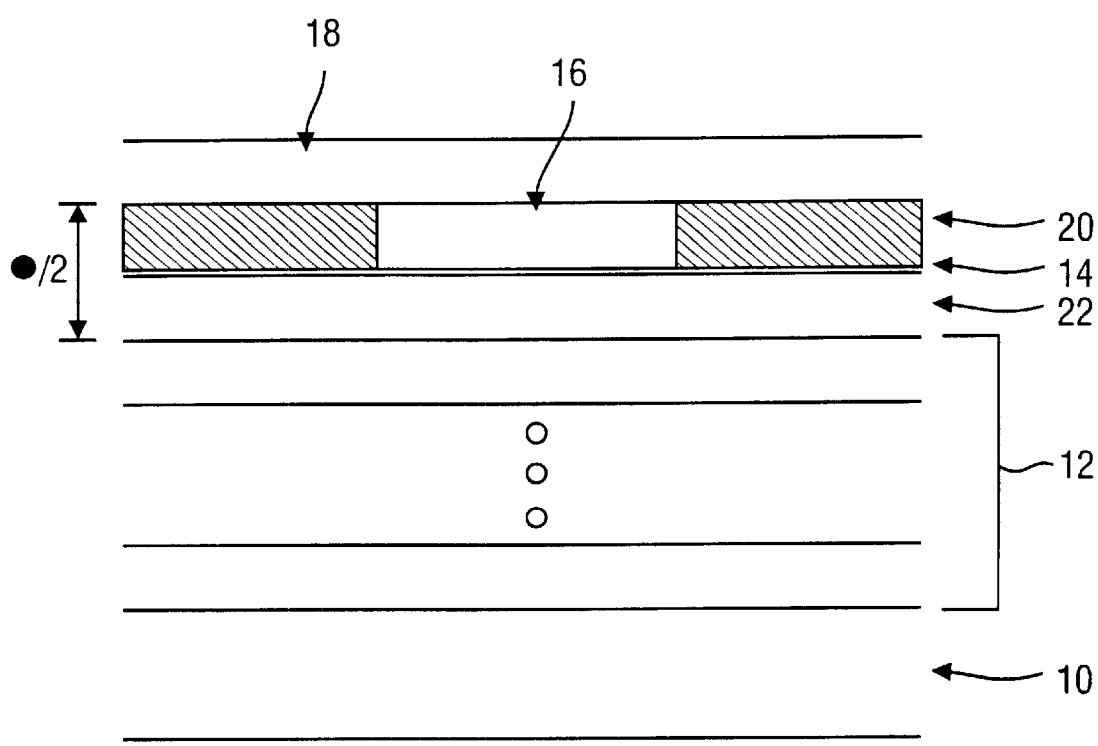
FIG. 1 Schematic cross-section of the half-wave VCSEL structure (not to scale) showing the native-oxide layer placed 200 Å from the single quantum well.
Figure 2:
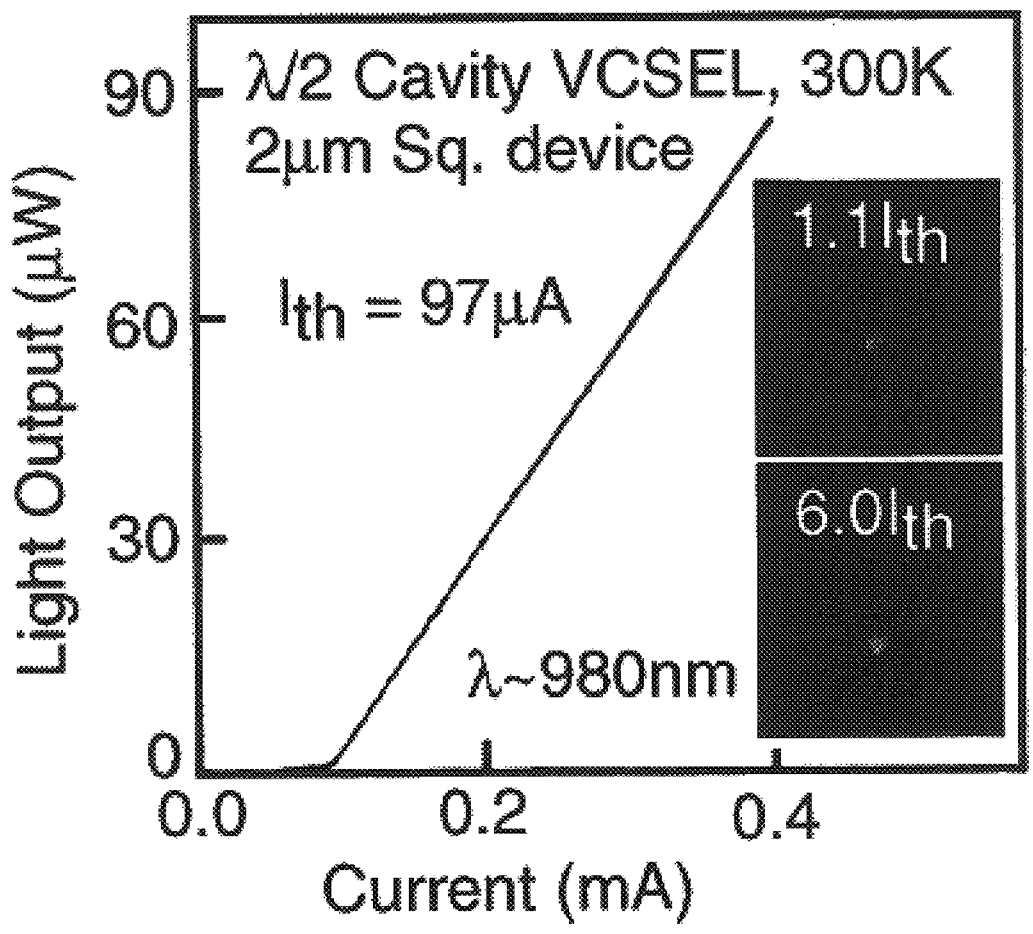
FIG. 2 Light output versus current measured CW, 300K for a 2 $\mu$m square half-wave cavity VCSEL with five pairs ZnSe/CaF DBRs for top mirrors. $I_{th}$=97 $\mu$A. The insets show near-field radiation patterns at 1.5 times threshold (top) and 6.0 times threshold (bottom).
Figure 3:
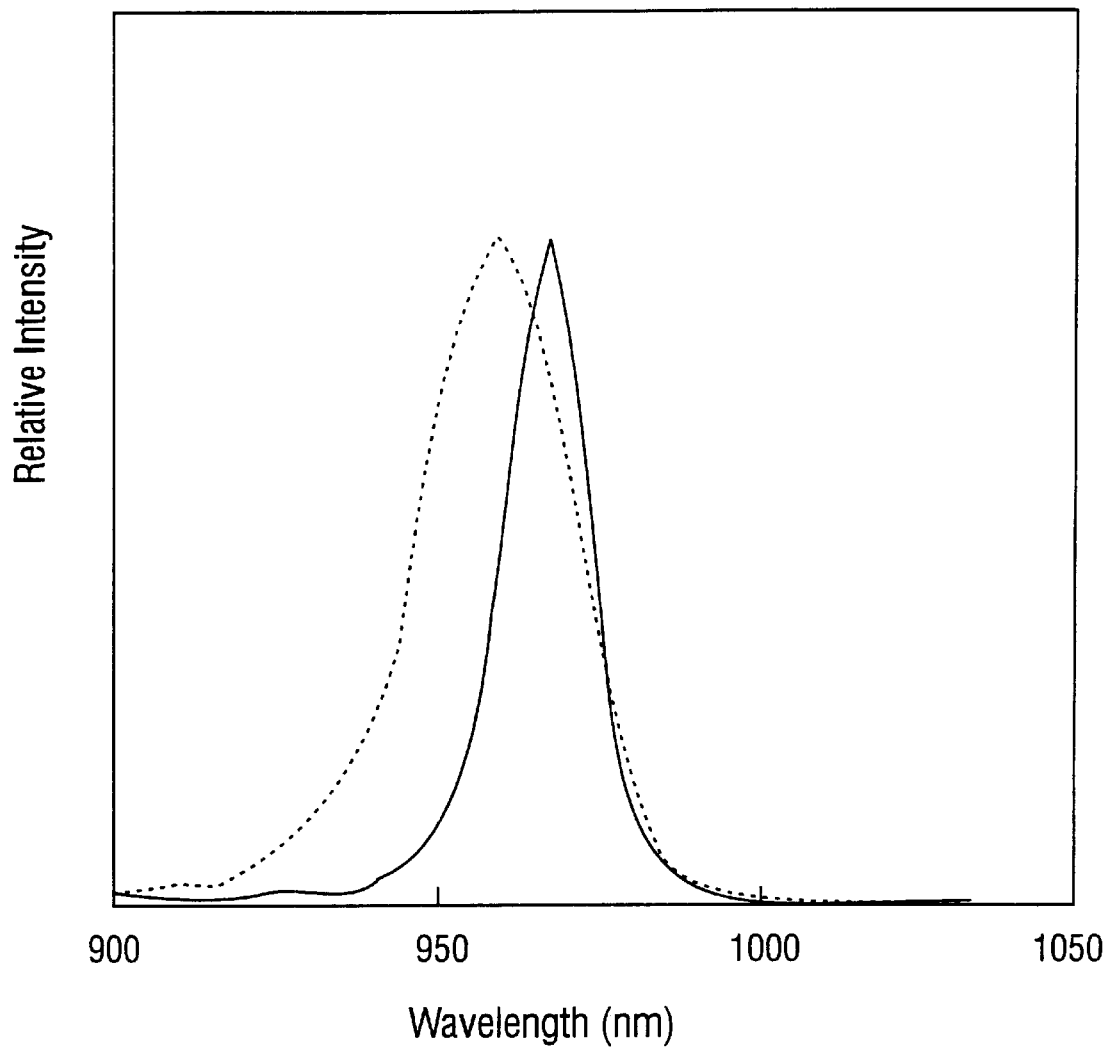
FIG. 3 Comparison of spontaneous emission spectra measured for the 2 $\mu$m square half-wave cavity VCSEL and the 8 $\mu$m square half-wave cavity VCSEL. (CW, 300K). 0 pairs ZnSe/CaF, J=240A/cm$^2$. Solid line, 2 $\mu$m sq. dashed line, 8$\mu$m sq.
Figure 4:
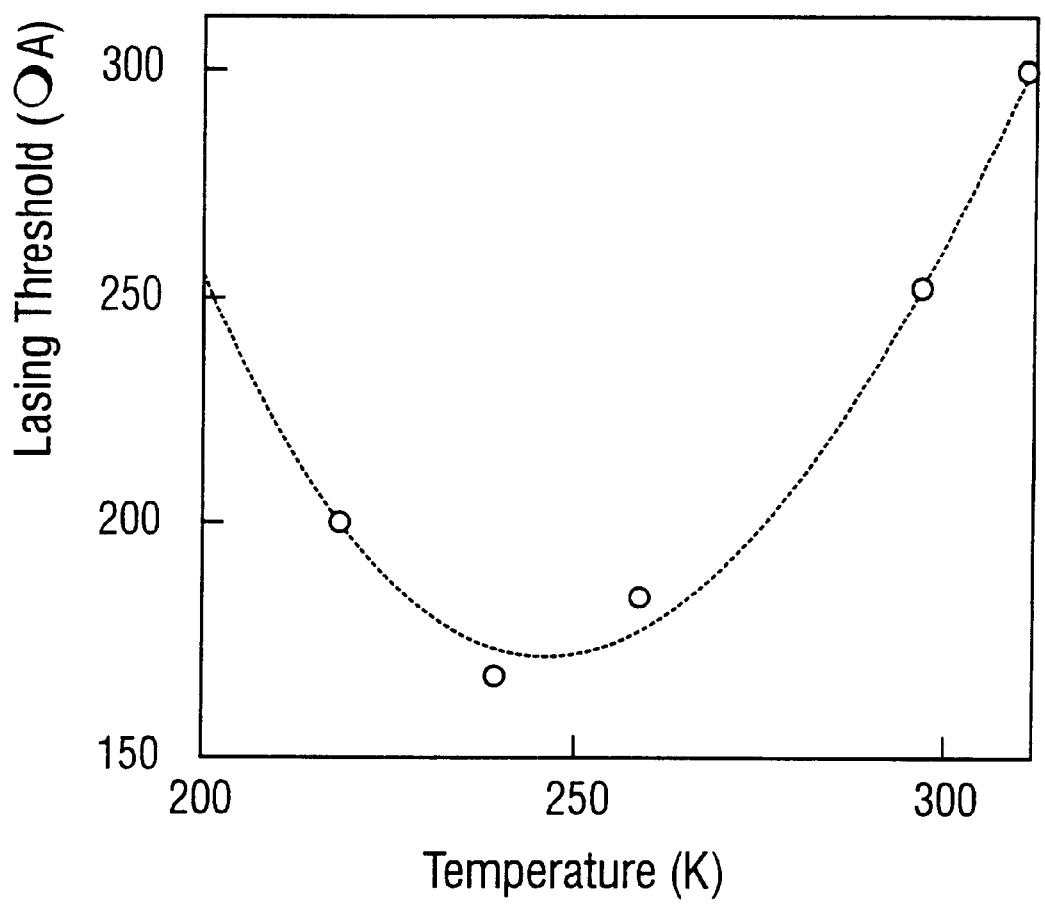
FIG. 4 Lasing threshold versus temperature for CW operation of an 8 $\mu$m square half-wave cavity VCSEL. $J_{th}$ (min.)=260A/cm$^2$.
Figure 5:
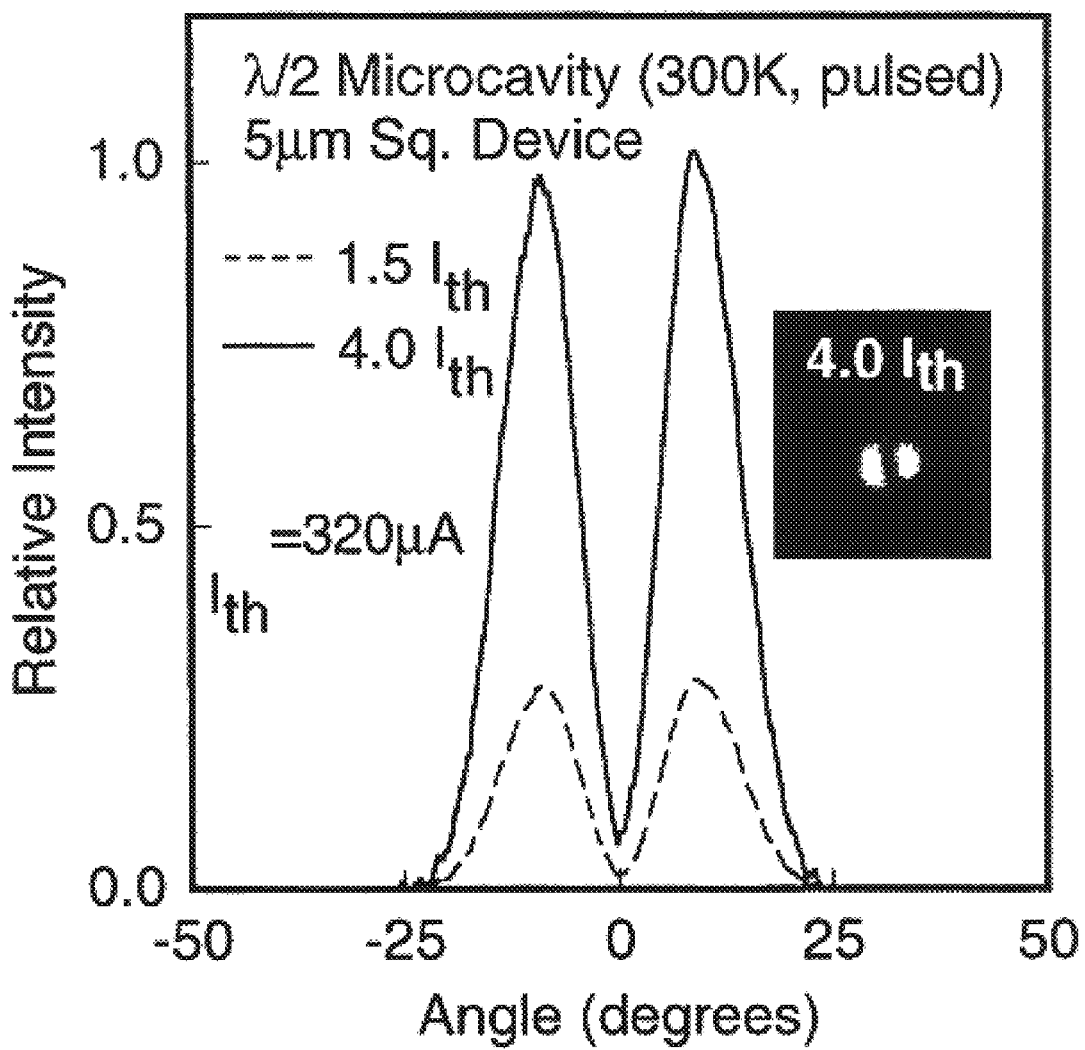
FIG. 5 Far-field radiation patterns for a 5 $\mu$m square half-wave microcavity VCSEL measured under pulsed. 300K conditions at 1.5 times threshold (dashed curve) and 4.0 times threshold (solid curve). $I_{th}$=320 $\mu$A. The inset shows near-field radiation pattern at 4.0 times threshold.
Figure 6:
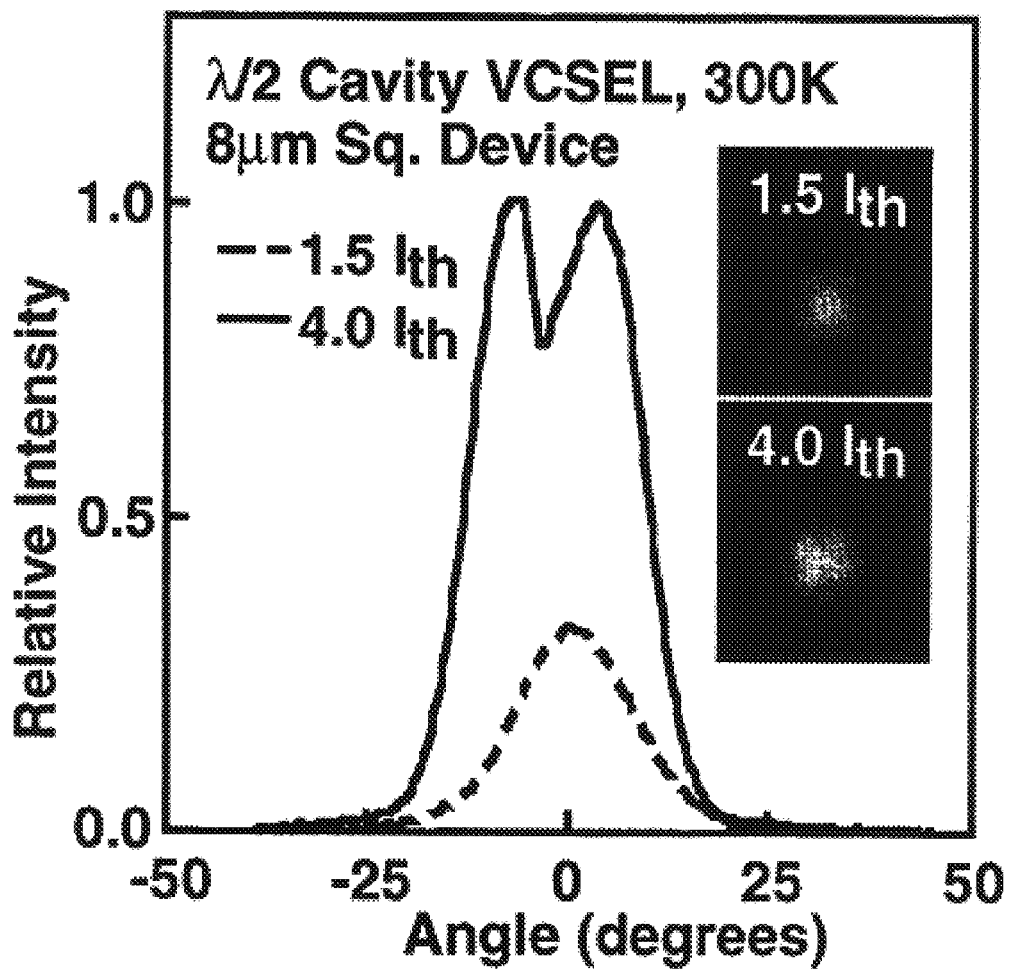
FIG. 6 Far-field radiation patterns for an 8 $\mu$m square half-wave microcavity VCSEL measured under pulsed operation (300K) at 1.5 times threshold (dashed curve) and 4.0 times threshold (solid curve). $I_{th}$=200 $\mu$A. The inset shows near-field radiation patterns at 1.5 and 4.0 times threshold.
Figure 7:
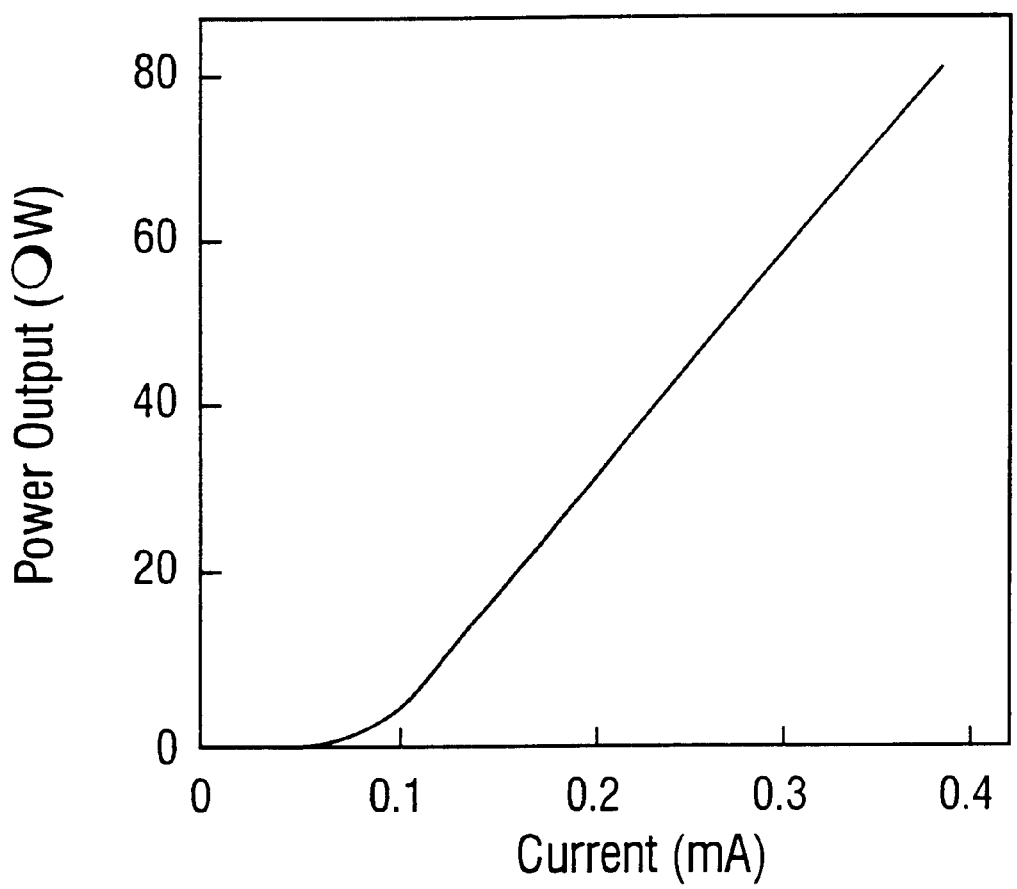
FIG. 7 Light (power output, $\mu$W) versus current curve (mA) measured CW at 300K for a 2 $\mu$m square half-wave cavity VCSEL with five pairs ZnSe/CaF$_2$ top mirrors. $I_{th}$=91 $\mu$A.
Figure 8:
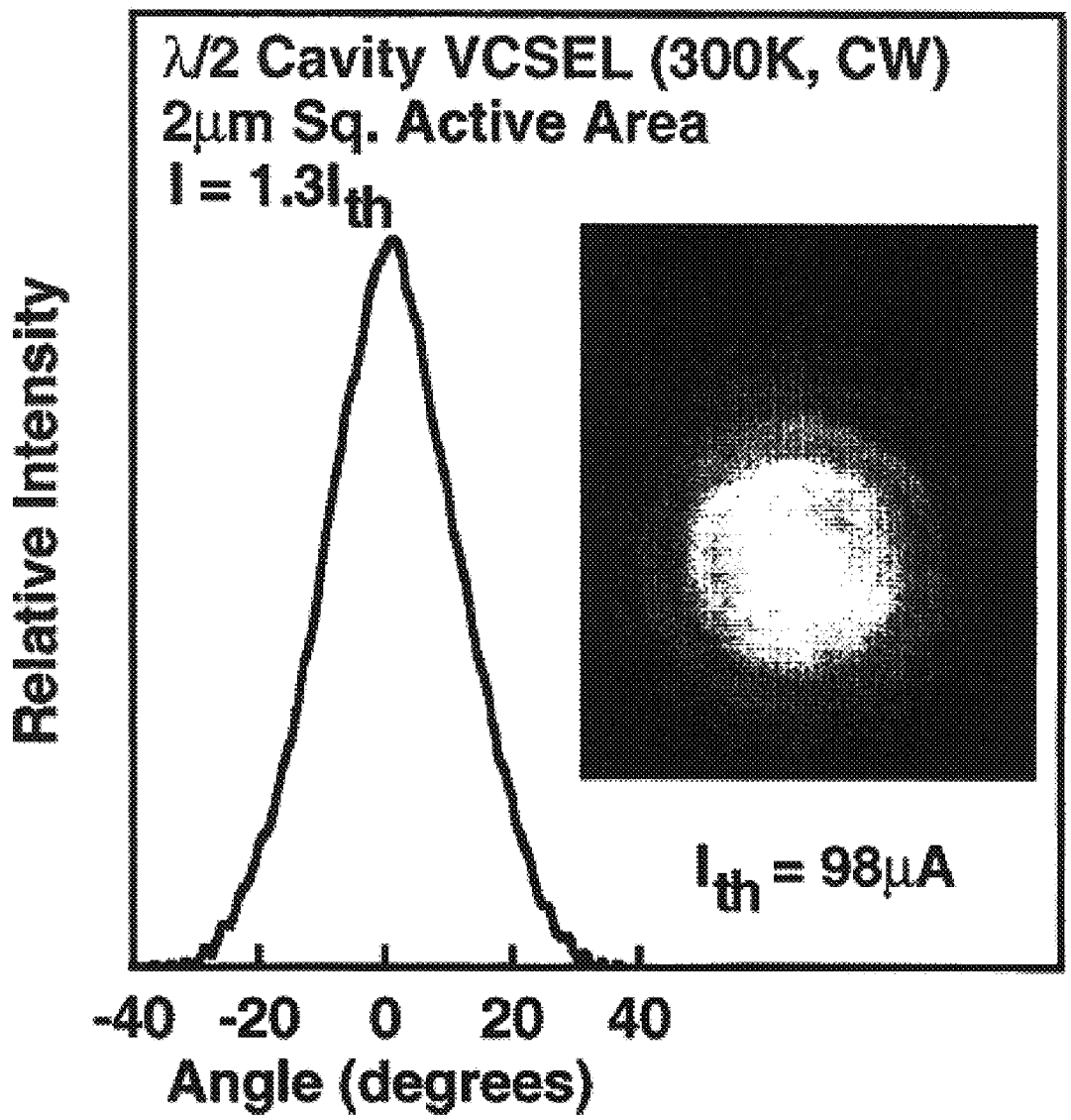
FIG. 8 Measured one-dimensional scan and 2-dimensional photograph of the far-field radiation pattern for a 2 μm square device operated at a current level of 130 μA, or 1.3 times threshold, (300K CW) I=1.31$_{th}$, I$_{th}$=98 μA.

FIG. 1 shows a schematic cross-section representing the epitaxial layers of the VCSEL after oxidation. The epitaxial structure is grown on a GaAs substrate by molecular beam epitaxy and consists of a 0.5 μm n-type GaAs buffer layer 10 followed by a 26 pair n-type GaAs/AlAs quarter-wave distributed Bragg reflector 12, a symmetrical undoped active region consisting of a single 80 Å In$_{0.2}$Ga$_{0.8}$As QW 14 sandwiched between adjacent layers of 100 Å GaAs barriers next to 100 Å Al$_{0.67}$Ga$_{0.33}$As barriers, and followed by a p-type AlAs hole injection layer 16 approximately a quarter-wave thick, and a p-type quarter-wave thick GaAs layer 18. The details of the native-oxide VCSEL fabrication for a wavelength thick cavity spacer are described in Huffaker. Deppe et al., (1994). An important difference in the design and fabrication of the half-wave cavity is that the oxidized region is only 200 Å from the QW (due to the thicknesses of the 100 Å GaAs and 100 Å Al$_{0.67}$Ga$_{0.33}$As barriers) as illustrated in FIG. 1. Therefore, significant index-guiding due to the native-oxide layer is expected. After the native-oxide is formed the VCSELs have defined active regions of 2 μm×2 μm squares due to the hole injection path. Not shown in FIG. 1 is the completion of the upper Bragg reflector which comprises five pairs of high contrast ZnSe/CaF$_2$ quarter-wave layers deposited on to the p-GaAs surface after metallization (Lei et al., 1991). Many of the VCSELs tested exhibit CW threshold currents in the 100 μA range. The lowest threshold device measured had a CW room-temperature threshold current of 91 μA with a lasing wavelength of ~9780 Å. Considering only the 2 μm square area, the calculated threshold current density is ~2.3 kA/cm$^2$. Larger active area devices have also been fabricated from the same epitaxial wafer using the native-oxide process as described for the 2 μm square active region. The minimum CW thresholds for the larger device dimensions are 316 μA for a 5 μm square active region and 220 μA for an 8 μm square active region. Therefore, the threshold current density for the 8 μm square device is quite low, with a calculated minimum value of ~340A/cm$^2$. The measured high threshold current density for the 2 μm square VCSEL is therefore most likely due to a combination of current spreading and mirror loss for the small size lasing mode.

The following examples are included to demonstrate preferred embodiments of the invention. It should be appreciated by those of skill in the art that the techniques disclosed in the examples which follow represent techniques discovered by the inventor to function well in the practice of the invention, and thus can be considered to constitute preferred modes for its practice. However those of skill in the art should, in light of the present disclosure, appreciate that many changes can be made in the specific embodiments which are disclosed and still obtain a like or similar result without departing from the spirit and scope of the invention.

EXAMPLE 1

One reason a half-wave cavity spacer is of interest is that spontaneous emission coupling to the parasitic waveguide modes of the cavity is theoretically predicted to be less than for the full wave cavity, but this difference between the cavities is not too large (Lin et al., 1994, Yamamoto et al., 1991). The bigger impact for the processing technique described herein is that the low refractive index $Al_xO_y$ layer can be positioned only a few hundred angstroms from the QW, with the potential for laterally controlling the lasing mode and the spontaneous emission. Herein are described the lasing characteristics of VCSELs which use the half-wave cavity spacer layer surrounding the single QW active region and the low refractive index $Al_xO_y$ layer.

The $Al_xO_y$ 20 is formed by the selective conversion of AlAs as described by Dallesasse et al. (1990). Half-wave cavity VCSELs with the layered structures as illustrated in FIG. 1 are fabricated with lateral dimensions of 8 μm, 5 μm, and 2 μm squares. The half-wave cavity VCSEL uses 26 pairs of n-AlAs/GaAs distributed Bragg reflectors (DBRs) for the bottom mirror, a half-wave cavity spacer composed of an n-AlAs layer 22 beneath the QW and p-AlAs layer on top and a p-GaAs cap layer as shown in FIG. 1. The top mirrors, not shown in the figure, are deposited as the last fabrication step and consist of five pairs of high contrast ZnSe/CaF DBRs. The details of the $Al_xO_y$ microcavity laser with a full wavelength cavity spacer have been discussed in Huffaker. Deppe, et al., 1994, (incorporated herein by reference). The important difference in the half-wave cavity structure is that the low-index $Al_xO_y$ layer is only 200 Å from the QW such that significant index-guiding may by expected. The lateral dimensions of the lasers are then defined electrically by the current injection path due to the $Al_xO_y$ insulator, and optically due to the refractive index step between the $Al_xO_y$ and unconverted p-type AlAs. Many of the 2 μm square devices have CW thresholds in the 100 μA range, with a minimum measured room temperature threshold of 91 μA. A slightly higher threshold 2 μm square device with a CW. 300K injection current threshold of 97 μA has also been made by the present inventors. Threshold for this device under 300K pulsed operation is 90 μA. The lasing wavelength of the 2 μm square devices is 978 nm, which is close to the spontaneous emission peak (with no cavity) from the QW.

The effect of the lateral index step of the $Al_xO_Y$ on the spontaneous emission spectra of the 2 μm and 8 μm square active region devices before the deposition of the five pairs of CaF/ZnSe was also measured. The measured spectrum for the 5 μm square active region is nearly identical to that of the 8 μm device. A consistent measurement on the 2 μm square active regions versus the 5 and 8 μm square active regions is the narrowing of the spontaneous emission spectrum due to the lateral index step. For this planar cavity, the spontaneous mode of an emitter (DeMartini et al., 1990; Ujihara. 1991; Bjork et al., 1993; Huffaker. Lin et al. 1994) is expected to fill the 2 μm square region.

The minimum CW room-temperature thresholds for the larger devices are 316 μA for a 5 μm square active region and 220 μA for an 8 μm square active region. The minimum room-temperature current density of 340 A/cm² for the 8 μm device for 300K is quite low. At 300K, the resonant cavity mode of this structure is tuned to a slightly shorter wavelength ($\lambda_{cav} \approx 971$ nm) than the InGaAs QW at ($\lambda_{QW} \approx 980$ nm). Therefore, a minimum CW threshold current of 166 μA is achieved for the 8 μm device at 240K, where the gain peak overlaps the cavity mode, with a corresponding threshold current density of 260 A/cm².

The inventors' work on full-wave microcavity lasers with a single QW active region, has shown stable lowest-order transverse mode operation for pump levels up to ten times threshold in a 5 μm device (Huffaker, Shin and Deppe, 1994). In the half-wave cavity lasers disclosed herein, stable lowest-order transverse mode behavior is observed in the 2 μm device, whereas the 8 μm device develops a higher order mode at 4 times threshold, and the 5 μm device operates in a higher-order transverse mode even at threshold. The far-field and near-field radiation patterns for the 5 μm square half-wave cavity laser at 1.5 and 4.0 times threshold. A double-lobed higher order transverse mode was observed throughout the range of operation for the 5 μm device and little change is observed in the far-field or near field radiation patterns. For the 8 μm device, the $Al_xO_y$ layer should have less effect on the transverse mode characteristics. Far-field and near-field radiation patterns for an 8 μm device at 1.5 and 4.0 times threshold, with a lasing threshold of 200 μA in pulsed operation (300K) were also determined. The device operates in its lowest order mode to 4.0 times threshold at which point four lobes are visible in the near-field.

The threshold current trend for the 8, 5, and 2 μm square VCSELs provide consistent evidence that the closely spaced $Al_xO_y$ layer plays a significant role in lateral index guiding. The minimum threshold currents on the devices are not too different than the typical values measured for several devices of each size. These show that the thresholds increase from 220 μA to 316 μA for a decrease in active region size from 8 μm to 5 μm, with the higher order mode selected for the 5 μm device, but with a significant drop in threshold current from 220 μA to 97 μA from the 8 μm to the 2 μm device, with again lowest order mode lasing achieved.

EXAMPLE 2

There is great interest in constructing lasers with a reduced mode volume to increase the spontaneous emission coupling factor, β. From the laser rate equation.

$$\frac{dn}{dt} = \left[\frac{\beta(N_2 - N_1)}{\tau_{sp}} - \frac{\omega}{Q}\right]n + \frac{\beta N_2}{\tau_{sp}} \qquad (1)$$

the threshold is given by the population inversion $(N_2 - N_1)_{th}/t_{sp} >> w/(bQ)$, and if b can be increased without decreasing Q, a reduction in the lasing threshold is expected. For the planar microcavities of interest in the present disclosure, both b and Q are dependent on the coupling between the cavity length and the transverse dimension of the lowest loss passive cavity mode (DeMartini et al., 1990). When the mode area is larger than the value of $A_{min} >> (\lambda \times L)/1-R$, where L is the effective cavity length and R is the mirror reflectivity the mode loss is limited by field propagation normal to the cavity, and there exists a continuous range of transverse modes of $A > A_{min}$ with nearly the same loss. For $A < A_{min}$, diffraction loss also becomes appreciable. Experimentally $A_{min}$ is found to dominate the lateral extent of the lasing mode (Huffaker, Lin et al., 1994. Osuge and Ujihara. 1994, Huffaker, Shin et al., 1994).

An important issue for the microcavity laser is how to reduce the lateral mode size without sacrificing mode Q, or with significant increase in b to maintain a high bQ product, or preferably both. By comparing both the spontaneous and lasing modes of various sized devices, it is shown herein that lateral index-confinement placed at the center of a planar microcavity appears to increase the spontaneous coupling to the lasing mode if the index step is placed within the spontaneous mode area. A continuous-wave threshold of 59 mA is measured at 250K for a 3 mm square active region.

Figure 9:
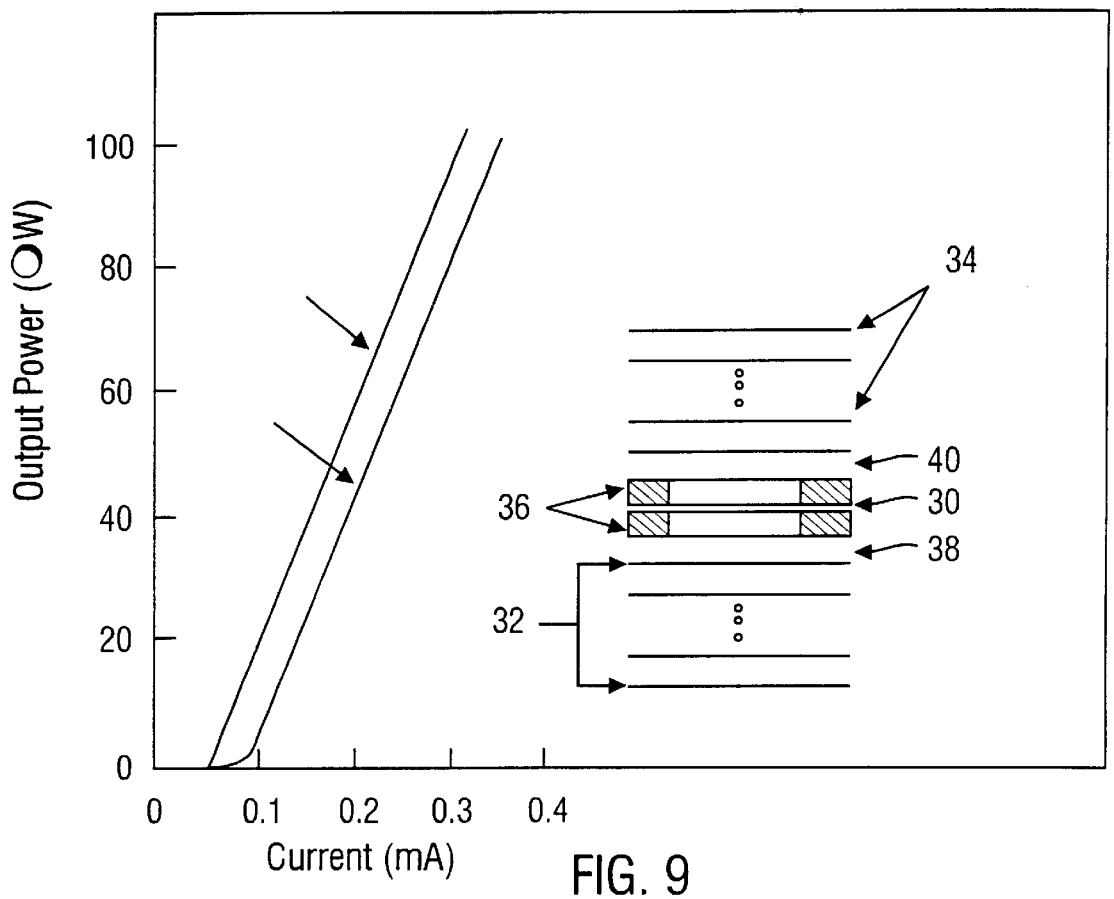
FIG. 9 Light versus current curves for the 3 μm index-guided planar half wave microcavity device at both 300 (right) and 250K (left) (CW). The inset shows a schematic of the half-wave cavity spacer.
Figure 10:
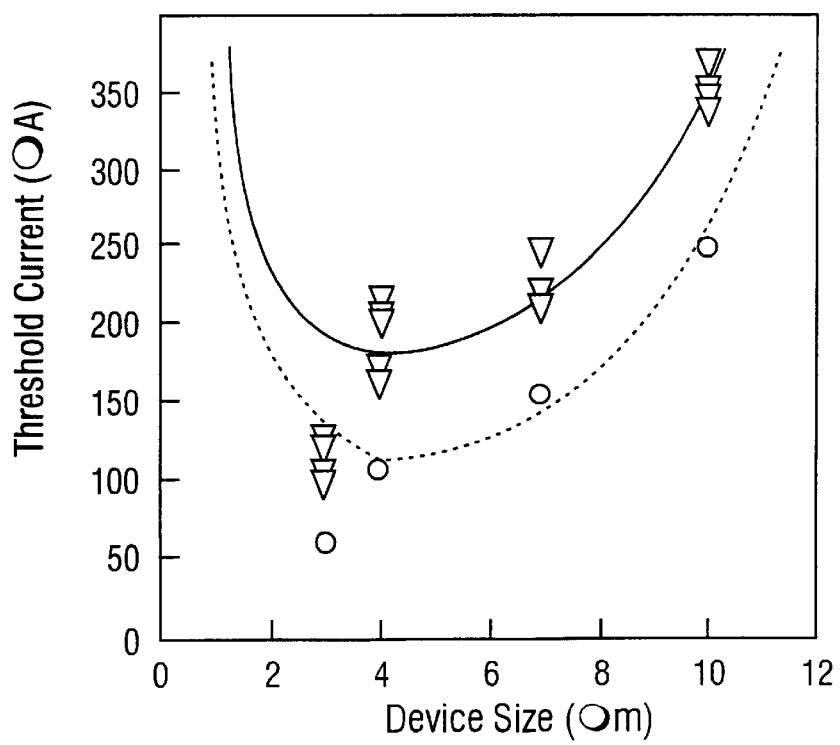
FIG. 10 Plots showing the measured threshold currents versus device size for 10, 7, 4, and 3 μm squares at 300 (reversed triangles) and 250K (filled circles), λ/2 cavity, CW. The 3 μm sized VCSEL is anomalous in its low threshold compared to the larger devices.
Figure 11:
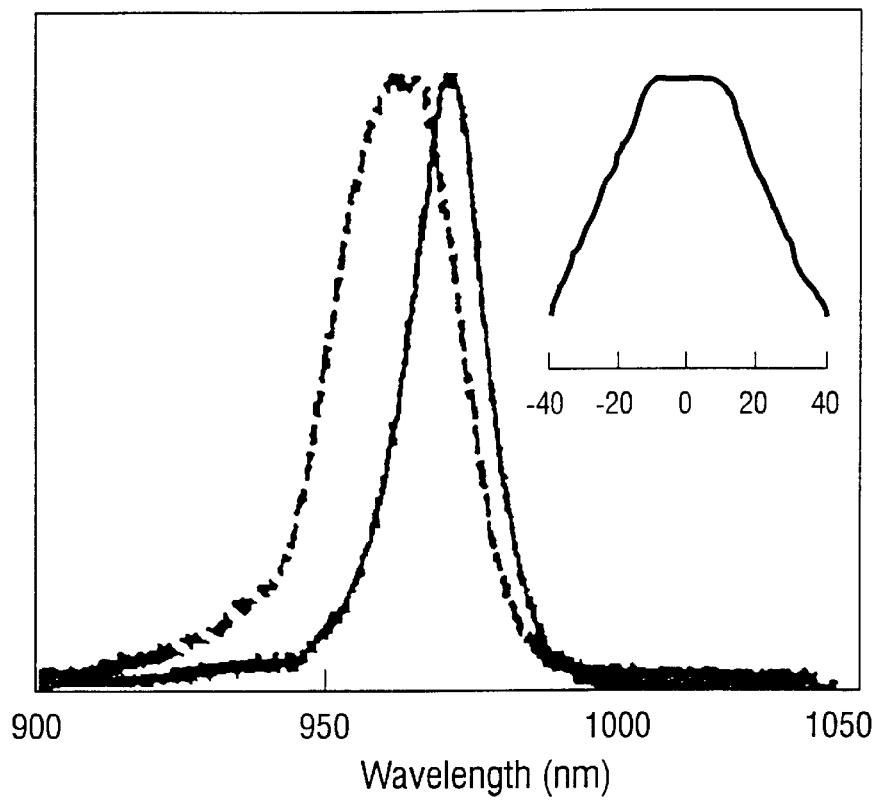
FIG. 11 Spontaneous spectrum of the 3 (solid line) and 4 μm (dashed line) VCSELs for the low Q cavity (without the CaF/ZnSe five pair Bragg reflector), 300K. CW, J=1.55 Acm$^{-2}$. The inset shows the angular radiation pattern (degrees) for the same low Q cavity.
Figure 12:
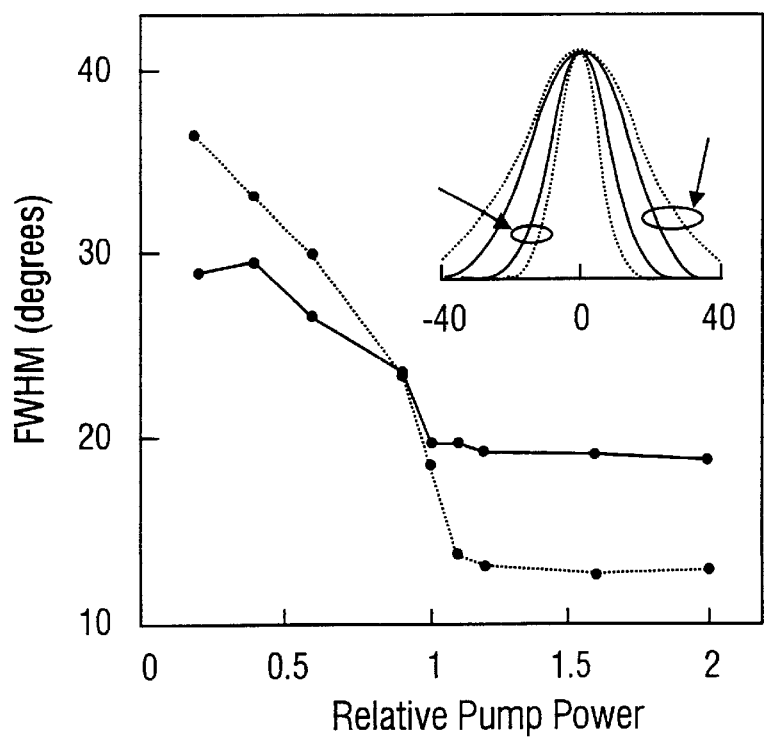
FIG. 12 Angular spontaneous and lasing characteristics of the high Q cavity (λ/2 cavity, 300K. CW) 3 μm (solid line) and 4 μm (broken line) lasers. Angular narrowing of the spontaneous emission as well as angular broadening for the lasing mode occurs for the 3 μm laser. The inset indicates angle (degrees), left arrow 1.2$_{th}$, right arrow, 0.21$_{th}$.

The microcavity lasers of the present example are based on half-wave cavity spacers and make use of a single InGaAs quantum well active region 30, a lower n-type AlAs/GaAs Bragg reflector of twenty-six pairs 32, and an upper Bragg reflector of a combination one pair AlAs/GaAs and five pairs CaF/ZnSe 34. A schematic cross-section of the device is shown in the inset of FIG. 9. The device includes a cavity spacer composed of an n-GaAs layer 38 beneath the QW and a p-GaAs cap layer 40. Using the process of selective oxidation of exposed AlAs (Dallesasse et al,. 1990; Maranowski et al., 1993; Krames et al., 1995; Huffaker. Deppe et al., 1994; Huffaker, Shin and Deppe. 1995; Hayashi et al., 1995; Lear et al. 1995. Yang et al., 1995; Choquette et al., 1995; Huffaker. Deppe and Shin. 1995), a low index $Al_xO_y$ lateral confinement layer 36 is constructed around the active region within the half-wave cavity spacer. The process yields a lateral index step from AlAs to $Al_xO_y$ of ~2.95 to ~1.7. The selective oxidation is used to fabricate lateral active regions ranging in size from 10 $\mu$m to 3 $\mu$m squares as measured by an optical microscope. The 3 $\mu$m device size is of interest, as a sharp transition is found when the lateral dimension is reduced from 4 $\mu$m to 3 $\mu$m.

The threshold current versus lateral dimension was plotted for several devices each of the 10, 7, 4, and 3 $\mu$m sizes measured continuous-wave at 300K. Further measurements were performed over a range of temperatures for the lowest threshold lasers and show that the minimum threshold of each device size occurs at ~250K. For the larger devices (>4 $\mu$m), the threshold current density increases as the active area is decreased, which is expected from increased current spreading and increased diffraction loss. However, in comparing the different active regions, the 3 $\mu$m size is anomalous, with a lower threshold than expected from the larger devices.

The angular radiation patterns versus pump level have been measured for all four device sizes. Both above and below threshold the 10, 7, and 4 $\mu$m lasers have nearly identical radiation characteristics, which might be somewhat surprising for above threshold operation. However, the similarity of the angular radiation characteristics for the different larger device sizes can be taken as evidence that, with respect to the lasing mode, these larger devices all simply appear planar, with the lateral mode profile dominated by the planar cavity design (Huffaker, Lin et al., 1994; Osuge and Ujihara, 1994; Huffaker. Shin et al., 1994). Since the 10, 7, and 4 $\mu$m devices have similar characteristics, the present example focuses on comparing the 4 and 3 $\mu$m sizes.

Since the five CaF/ZnSe Bragg pairs are deposited as the last processing step, the devices are first characterized without these upper mirrors. The spontaneous emission spectra were measured for the 3 and 4 $\mu$m devices before completion of the mirrors. A spectrum narrowed by a factor of ~1.8 is consistently measured for all the 3 $\mu$m devices as compared to the 4 $\mu$m and larger devices. The differential slope efficiencies are also measured for the 3 and 4 $\mu$m devices before the deposition of the CaF/ZnSe DBRs, for which case the normally directed spontaneous emission is totally radiated from the top of the device. These spontaneous slope efficiencies are measured to be identically 6% for both the 3 $\mu$m and 4 $\mu$m devices. The angular radiation patterns measured before the completion of the mirrors were found to be identical for all device sizes.

Alter completion of the upper Bragg reflectors, the angular radiation patterns are again measured below and above threshold. The increased mirror reflectivity along with the tight lateral index confinement decreases the angular radiation pattern in spontaneous emission from the 3 $\mu$m sized device as compared to the 4 $\mu$m. This, and the spectral narrowing are unexpected results, which are attributed to the lateral index confinement. The same measurements were repeated for a second 3 $\mu$m device, with the similar angular narrowing of the spontaneous emission measured. For laser operation, the expected result of the tighter lateral confinement was measured, with the 3 $\mu$m cavity showing an increased angular width compared with the 4 $\mu$m and larger devices.

The planar microcavity has been analyzed previously to characterize the radiation field from a confined point source emitter (Ujihara, 1991; Osuge and Ujihara. 1994. Deppe and Lei, 1992; Line et al., 1994; Deng et al., 1995). Using the derivation given in Deng et al. (1995), a mode size. $A_{min}$ of ~9 $\mu$m diameter is calculated for a single frequency point source confined in this dielectric cavity design. The much smaller measured mode sizes for the 10, 7, and 4 $\mu$m devices of ~3–4 $\mu$m diameter may indicate a significantly smaller than expected lasing mode Q. Because its spectrum is much broader than the cavity mode, each true spontaneous point source in fact radiates a mode into the cavity normal having an angular distribution set by the Bragg reflector contrast ratio and frequency spread (Deppe and Lei, 1992), as opposed to the mirror reflectivity (or $A_{min}$). The angular spontaneous emission is narrowed somewhat from the low Q cavity value of a full-width at half-maximum of ~54°, to the high Q cavity value of ~38°, 4 $\mu$m device. In Lin et al., 1994 (incorporated herein by reference) the saturated spontaneous coupling to the cavity normal mode is estimated to be in the 15–20% range for similar ideal cavities. The measured 6% fractional coupling for the low Q cavities is therefore likely limited by non-radiative recombination. Assuming the 6% coupling into the spontaneous mode of the planar cavity is maintained for increased mirror reflectivity (Deppe and Lei, 1992) allows an estimate of β for the 4 and 3 $\mu$m lasers.

Each point source couples to the lasing mode with its own spatially dependent coupling factor, β(x,y), dependent on the angular intensity distribution of the spontaneous mode relative to the angular intensity distribution of the lasing mode, as well as the spatial location of the emitter relative to the lasing mode center in the cavity, taken as (x,y)=(0.0). The most important difference between the 4 and 3 $\mu$m cavities is the change in the fractional angular coupling to the lasing mode, that is, the angular coupling of the spontaneous mode to the lasing mode. The total fractional coupling of the spontaneous emission to the lasing mode for an emitter located at the center of the lasing mode is estimated to be $$\beta(0,0) \approx 0.06 \times (\tfrac{1}{2}) \times \theta_L^2/\theta_{Sp}^2,$$

where the ½ factor accounts for the polarization coupling. The 4 $\mu$m laser has half-width angles ($e^{-2}$) of $\theta_L \approx 11.8°$ and $\theta_{Sp} \approx 34.5°$, giving β(0.0)~0.0035, while for the 3 $\mu$m laser the half-width angles are $\theta_L \approx 16.4°$ and $\theta_{Sp} \approx 25.9°$, giving β(0.0)~0.012. Using Gaussian beam approximations, the 3 $\mu$m sized laser has a spot size of ~2.2 $\mu$m diameter while the 4 $\mu$m device has a spot size of ~3.0 $\mu$m diameter. Assuming a uniform pump rate within the 3 and 4 $\mu$m device areas along with the intensity spot sizes yields spatially averaged coupling factors of $\beta \sim 2.5 \times 10^{-3}$ for the 3 μm device and $\beta \sim 7.9 \times 10^{-4}$ for the 4 μm device. The angular narrowing therefore yields a β increase of a factor of 3 for a volume decrease of 1.8, and which coincides with the threshold.

EXAMPLE 3

The native oxides of AlAs, AlGaAs, and GaAs have been studied for their use in device fabrication and their role in device reliability (Tsang, 1978; Liu et al., 1981; Dallesasse, El-Zein, et al., 1990; Dallesasse, Holonyak et al., 1990; Richard et al., 1995). The chemical instability of high Al composition AlGaAs, in particular, limits its use in commercial applications, despite its potential importance. For example, the binary compound AlAs might readily serve as a transparent substrate for light emitting diodes or lasers since it would remove the difficulty of controlling the stoichiometry of AlGaAs. On the other hand, degradation in the room environment is so rapid that without some protective layer a thick (tens or hundreds of microns) exposed AlAs layer can decompose within minutes. AlAs layers of more moderate thickness (<0.1 μm) are also desirable in the distributed Bragg reflector (DBR) layers of AlAs/AlGaAs/InGaAs vertical-cavity surface-emitting lasers (VCSELs) since they simplify the epitaxial growth and maximize the semiconductor DBR contrast ratio. The long term reliability of this type of laser can also be questioned, especially for VCSELs based on simple etched pillars (Jewell et al., 1991). As a third example, the high Al composition AlGaAs can be attractive for edge-emitting semiconductor lasers to maximize optical confinement and therefore reduce waveguide loss and lasing threshold. But again, facet degradation can limit the laser lifetime, especially in high power diode lasers, and appears related to the AlGaAs composition (Garbuzov et al., 1992).

The decomposition of AlAs and AlGaAs has recently been studied extensively (Dallessasse. El-Zein, et al., 1990), and a novel process has been demonstrated based on the "wet" oxidation of AlAs or high Al composition AlGaAs (Dallesasse, Holonyak et al. 1990). The wet oxidation is performed in a steam environment at an elevated temperature ranging from 400 to 500° C. and results in a high quality native $Al_xO_y$. This native oxide has proven especially useful for VCSEL fabrication, providing both lateral photon and carrier confinement (Huffaker. Deppe. et al., 1994). $Al_xO_y$ layers >0.1 μm of thickness over large areas have also been demonstrated (Dallesasse. Holonyak et al., 1990), and the wet oxidation has been proven effective in increasing device reliability (Richard et al. 1995). In spite of these successes however, the wet oxidation possesses some drawbacks due to the high rate at which the oxidation proceeds, and the strain that can result at the $Al_xO_y$-semiconductor interface. Thermal cycling such as for contact annealing is problematic due to cracking of the $Al_xO_y$ and the semiconductor crystal, and is avoided by metallizing prior to wet oxidation (Richard et al., 1995).

Herein is presented a process by which AlAs is effectively sealed against further decomposition. The sealant is formed by a rapid thermal anneal (RTA) to a temperature of ~500° C. to 600° C. in forming gas containing a small fraction of $O_2$, after exposure of the AlAs surface to the typical room-temperature ambient. The surface barrier layer thus formed is thin and impermeable to further wet oxidation, even at elevated temperatures, and can be thermally cycled. As a protective layer, it is shown that the RTA surface oxide has features that in some applications are more attractive while in others are complementary to the thick native oxide formed through wet oxidation. To demonstrate its potential in device fabrication the RTA oxide is used to mask a wet oxidation and form a multi-mode index-confined AlAs/GaAs VCSEL.

Figure 13A:
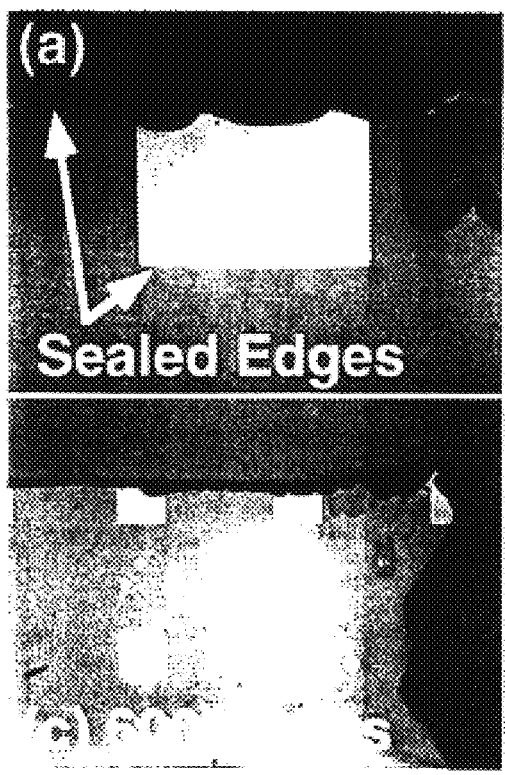
FIG. 13A, FIG. 13B, FIG. 13C and FIG. 13D. Optical microscope photographs looking down on two pieces of the same wafer exposed to a wet oxidation of 430° C. for 15 min. The wafer piece of FIG. 13A (arrows indicate sealed edges) and FIG. 13C has first been exposed to a 600° C., 30 sec rapid thermal anneal in forming gas, while the piece of FIG. 13B (arrows indicate Al$_x$O$_y$) and FIG. 13D has not. The rapid thermal anneal blocks the AlGaAs decomposition due to the wet oxidation.
Figure 13B:
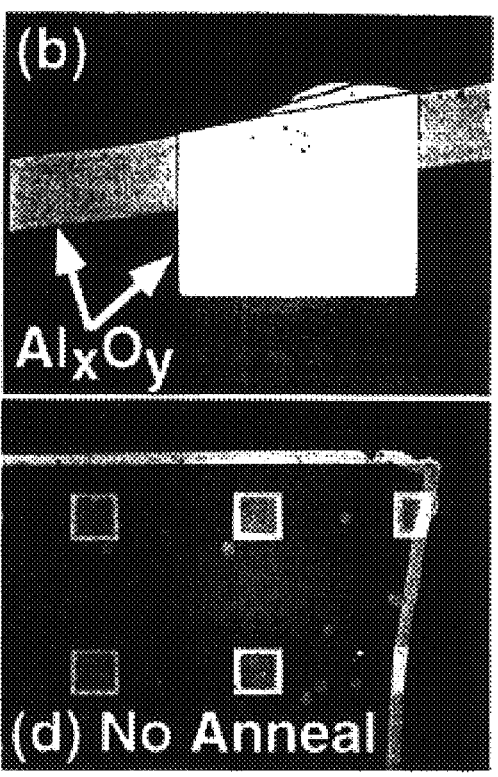
Figure 13C:
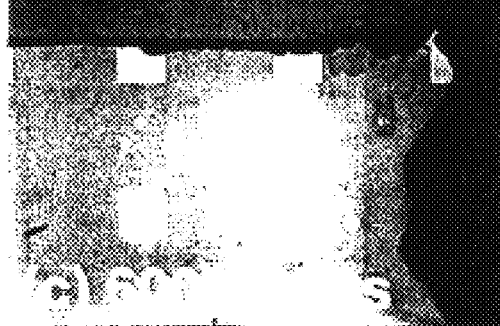
Figure 13D:
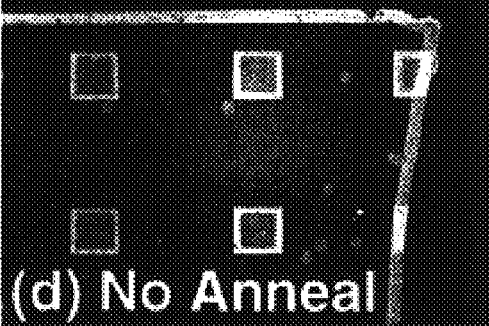

FIG. 13A, FIG. 13B. FIG. 13C and FIG. 13D show four photographs looking down on two different pieces of an AlAs/AlGaAs/GaAs heterostructure, and illustrates the effectiveness of the RTA surface oxide as a barrier against wet oxidation. The epilayer structure consists of four periods of GaAs (800 Å)/$Al_{0.90}Ga_{0.10}As$ (150 Å)/AlAs (1200 Å)/$Al_{0.90}Ga_{0.10}As$ (150 Å) layers followed by GaAs (800 Å), AlAs (~400 Å), an $Al_{0.90}Ga_{0.10}As$ etch stop layer (100 Å), and a GaAs (800 Å) cap layer. Square mesas of 150 μm per side on 500 μm centers are defined by selectively removing the 800 Å GaAs top layer by wet etching to expose the $Al_{0.90}Ga_{0.10}As$ etch stop layer. After the selective etch, the sample of FIG. 13A and FIG. 13C is annealed at 600° C. for 30s in forming gas containing ~10% dry oxygen. An undoped GaAs substrate is placed face down on top of the sample to prevent As desorption. This sample is then placed in a wet oxidation furnace along with the second processed heterostructure from the same wafer, shown in FIG. 13B and FIG. 13D, which has not undergone the RTA. Both wafers are exposed to the steam ambient for 15 min at 430° C. FIG. 13C shows that the RTA surface oxide has sealed both the surface of the $Al_{0.90}Ga_{0.10}As$ and the edges of the 150 μm square mesas, as well as the exposed AlAs layers at the ragged edges of the wafer. FIG. 13A shows a higher magnification photograph of the sealed edges. For comparison, the sample shown in FIG. 13B and FIG. 13D shows the typical wet oxidation expected. FIG. 13B shows that in the 15 min wet oxidation anneal at 430° C. the upper exposed $Al_{0.90}Ga_{0.10}As$/AlAs surface layer (~500 Å thickness) has completely oxidized and that the $Al_xO_y$ front has diffused underneath the GaAs mesa edges to a distance of 30 μm. From the exposed cleaved wafer edge the buried AlAs layers have oxidized laterally for a distance of ~50 μm. From examining the wet oxidation behavior for other RTA temperatures, it is discovered that an RTA performed at ~400° C. prior to wet oxidation offers little protection, while RTA at 500° C. shows significant blockage of the wet oxidation, and that the wet oxidation is fully blocked after a 600° C. RTA.

Figures 14A, 14B:
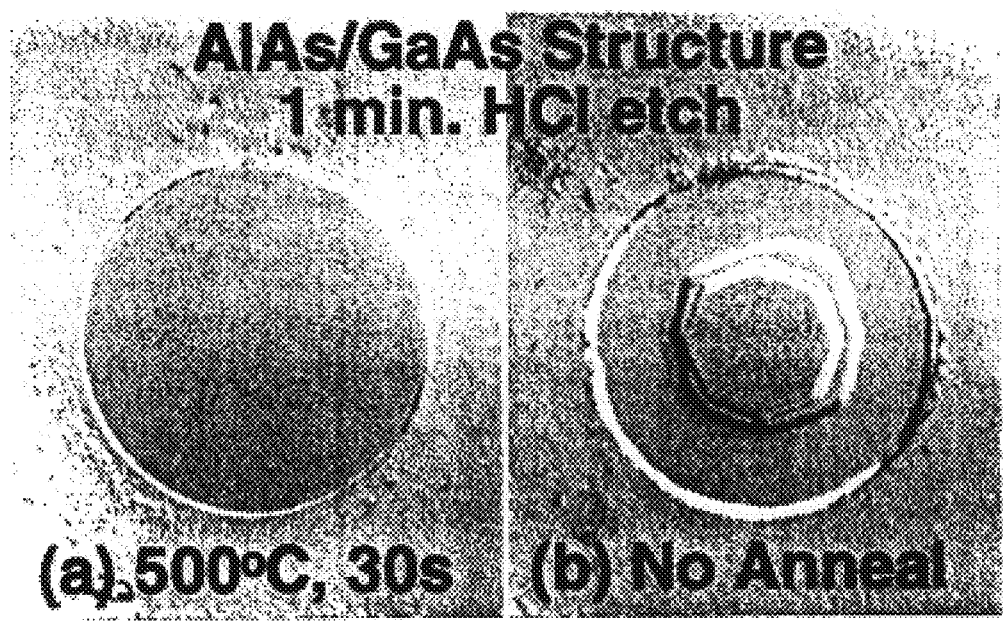
FIG. 14A and FIG. 14B. Optical microscope photographs showing the effectiveness of the rapid thermal anneal of exposed AlGaAs in blocking a wet chemical i minute etch in 1:1 HCl:H$_2$O.

The RTA surface oxide also protects the exposed AlAs layers against chemical etching in a room-temperature HCl solution. FIG. 14A and FIG. 14B show optical microscope photographs looking down on the top of two 60 μm AlAs/GaAs mesas after an $HCl:H_2O$ (1:1) etch for 1 min. The mesas are formed by isotropically wet etching through five periods of alternating AlAs/GaAs layers. The mesa in FIG. 14A has been annealed at 500° C. for 30s before the 1 min HCl etching and shows no effect of the etch. In contrast to the annealed mesas, the AlAs layers in the mesa of FIG. 14B have not been sealed and the edges have been significantly etched after a 1 min. exposure in the HCl solution, with the remaining GaAs layers subsequently collapsing. After 5 min, half of the annealed mesas show signs of etching and after 10 min all mesas are significantly etched. Increasing the anneal time to 2 min at 500° C. does not improve the resistance of the protective layer to the HCl etch over the 30s anneal, and indicates that the dense surface oxide is formed during the 30s anneal at 500° C. and likely halts further oxide growth.

Figures 15A, 15B:
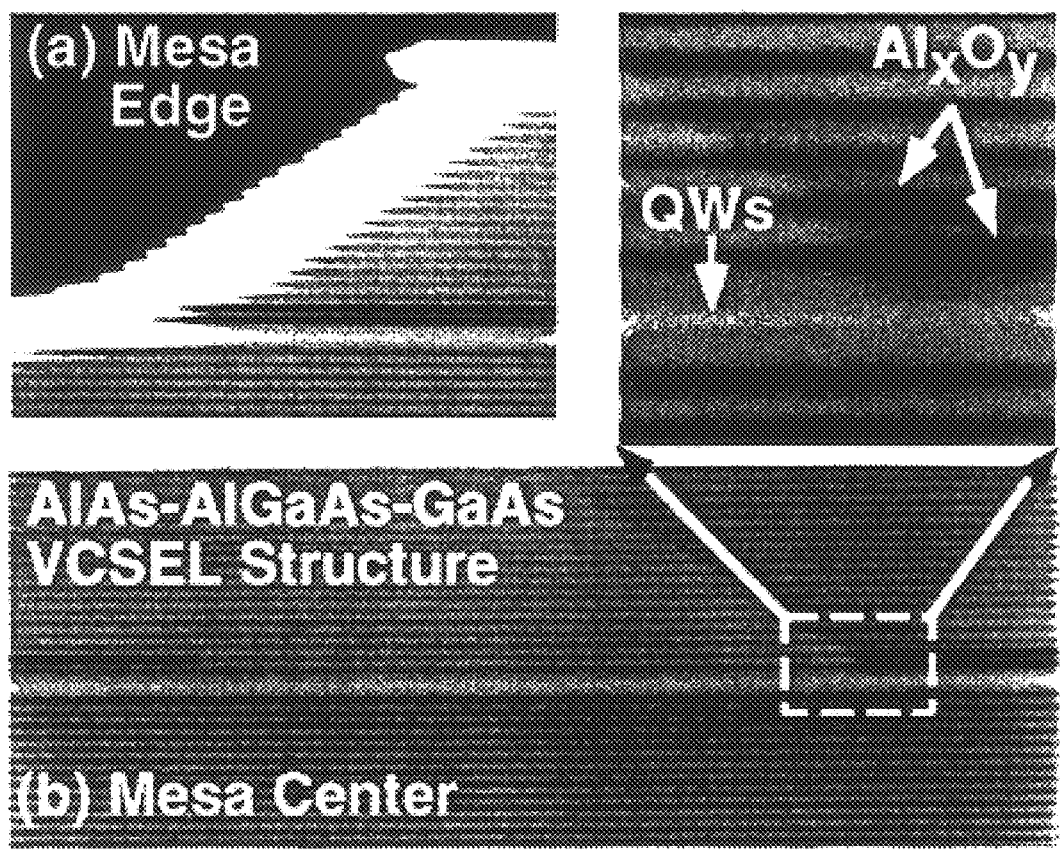
FIG. 15A and FIG. 15B. Scanning electron microscope photograph demonstrating the use of the rapid thermal anneal of the exposed AlGaAs mesa edge to mask a wet oxidation.

The present inventors have demonstrated how the wet oxidation of AlAs can be used to fabricate buried current and photon confining layers within a VCSEL cavity to achieve improved device performance (Huffaker, Deppe et al., 1994). This wet oxidation process has been extended to all-epitaxial VCSELs by adjusting AlGaAs compositions within the upper DBR to control the lateral oxidation rates in different layers (Choquette et al., 1994). Herein is shown how the RTA surface oxide can be used instead to selectively block the wet oxidation, and achieve deep lateral oxidation in only the preferred DBR layers closest to the VCSEL active region (Huffaker, Deppe. et al., 1994; Choquette et al. 1994). The advantage of the process is the simplified epitaxial growth which removes the need for critical control of the AlGaAs composition in the DBR layers. The epitaxial VCSEL structure is grown by metal-organic chemical vapor deposition on an n-type GaAs substrate and consists of a lower 35.5 pair n-type AlAs/Al$_{0.15}$Ga$_{0.85}$As DBR, an Al$_{0.60}$Ga$_{0.40}$As undoped full-wave cavity spacer layer cladding three 80 Å GaAs quantum wells (QWs), followed by an upper 22 pair p-type DBR. The sealing of the upper AlAs DBR layers against wet thermal oxidation is demonstrated in the stripe mesa after oxidation shown in the scanning electron microscope cross-section of FIG. 15A and FIG. 15B. FIG. 15A and FIG. 15B show the mesa edge and center along with a blow-up of the buried Al$_x$O$_y$ layer formed by wet oxidation. The 60 µm wide mesa is formed by wet-etching through the top 20 pairs of p-AlAs/Al$_{0.15}$Ga$_{0.85}$As DBRs. After etching, the exposed AlAs layers are sealed by RTA in forming gas at 500° C. for 30s. A second 100 µm wide mesa centered on the 60 µm sealed mesa is then formed by etching through the remaining 1.5 pairs to expose the two AlAs layers closest to the active region for wet oxidation. The wafer is wet oxidized at 430° C. for 30 min. As shown in FIG. 15A, the two unsealed AlAs layers undergo rapid lateral oxidation while the top 20 mirror pairs remain sealed.

EXAMPLE 4

Figure 16A:
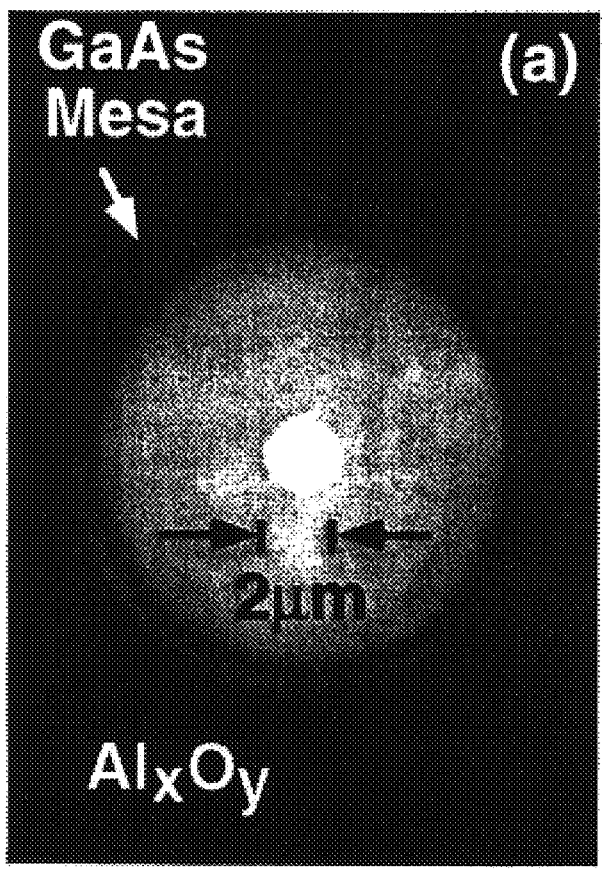
FIG. 16A. Scanning electron microscope cross-section of d=2 μm microcavity formed by selective oxidation. Top arrow indicates GaAs mesa. Bottom section is Al$_x$O$_y$.
Figure 16B:
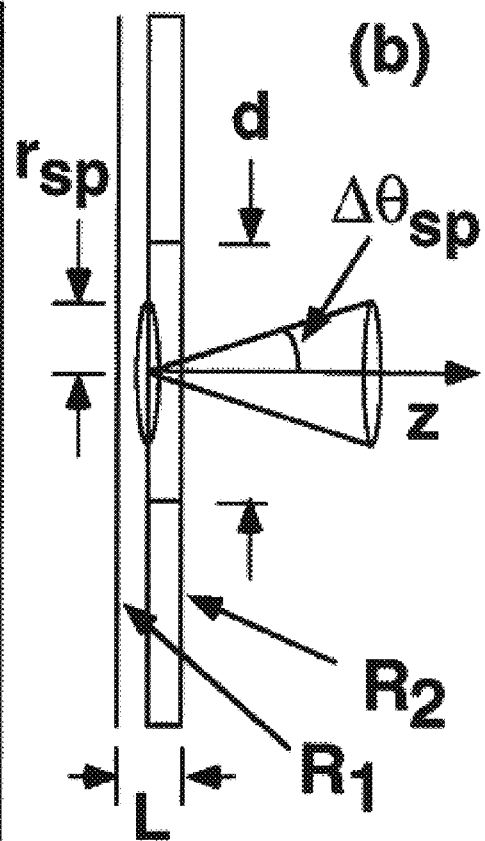
FIG. 16B. Schematic illustration of the microcavity cross-section.

In the microcavities of the present example, lateral index-confinement is fabricated in a half-wave cavity spacer using the selective conversion of high Al composition AlGaAs to Al$_x$O$_y$ (Dallessasse et al., 1990) to form light emitting active regions ranging in size from d=12 µm to d=2 µm (Huffaker and Shin et al., 1995). FIG. 16A shows a scanning electron microscope image looking down on an oxidized structure of a d≈2 µm active region. A schematic cross-section of the single InGaAs/GaAs quantum well heterostructure after oxidation is given in (Huffaker and Shin et al., 1995). Twenty-six n-type AlAs/GaAs quarter-wave pairs form the lower distributed Bragg reflector which is R$_2$ of FIG. 16B, while the reflectivity of the upper mirror R$_1$ is varied by adding CaF/ZnSe quarter wave-pairs to the quarter-wave thick p-type GaAs contact layer (Huffaker and Shin et al., 1995). Similar studies have been done using various devices and mirror conditions, and presented herein are representative data on two device sizes of d=2 and d=12 µm.

Figure 17:
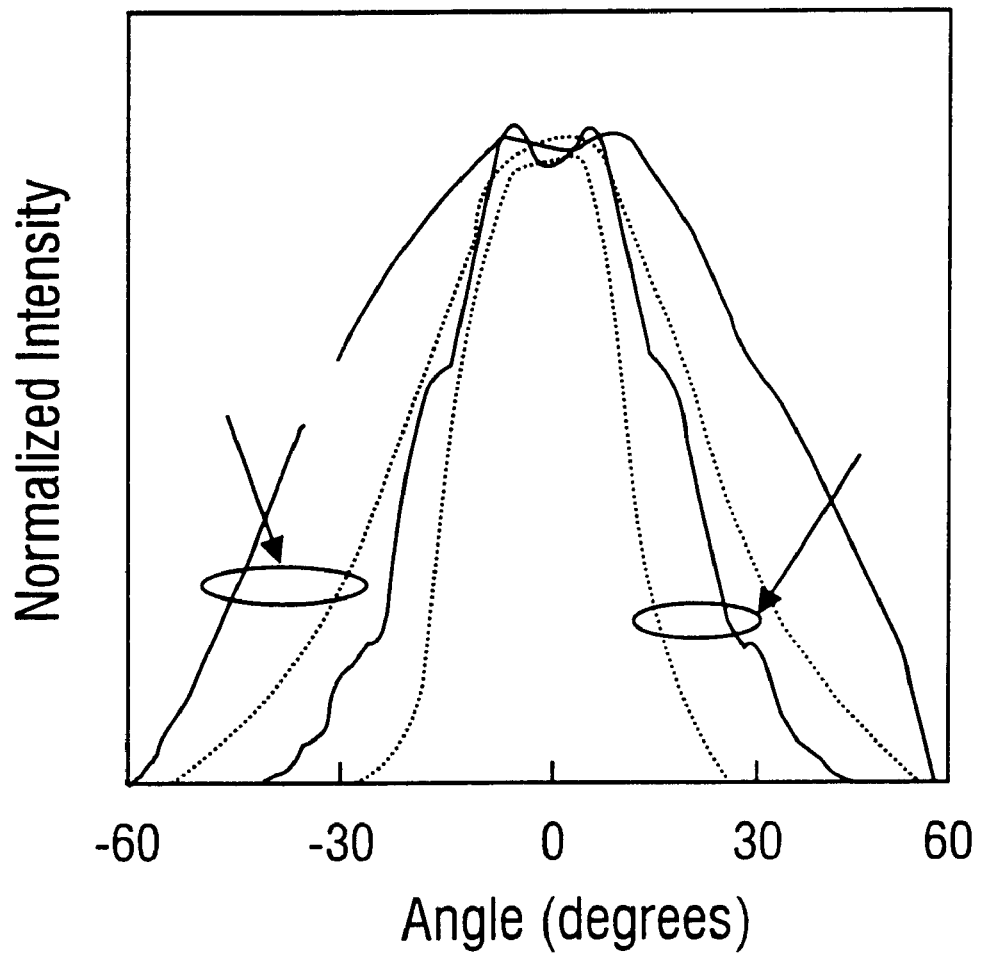
FIG. 17. Far-field radiation patterns at 300K for the d=12 μm (left arrow), low Q (solid lines) and high Q (dotted lines), and d=2 μm (right arrow), low Q and high Q microcavities. J=222A/cm$^2$. T=300K.

FIG. 17 shows far-field radiation patterns for what are called low Q and high Q quasi-modes in the d=2 and d=12 µm microcavities measured at a current density of J=222A/cm$^2$ at T~300K. Although the cavities are somewhat detuned at room temperature, the low current density limits bandfilling and spectral broadening. The low signal power then requires the measurement detector to be placed within 5 µm for a 600 µm pin-hole necessitating the far-field measurement outside a dewar system. The low Q quasi-modes are formed with only the single quarter-wave p-type GaAs layer (0 pairs of CaF/ZnSe) as R$_1$, while the high Q quasi-modes are formed with an additional three pairs of CaF/ZnSe. Spontaneous characteristics of device sizes for d≧4 µm are similar to the d=12 µm (Huffaker and Deppe et al., 1995). However, FIG. 17 shows the far-field change for the d=2 µm device is significant. Though some angular narrowing is expected for increased quasi-mode Q due to its planar microcavity area dependence, which is observed for the d=12 µm quasi-modes, the d=2 µm quasi-modes have narrower far-fields yet. If the d=2 µm high Q mode is approximated as Gaussian then one estimates from the FIG. 17 far-field a spontaneous mode radius of r$_{sp}$~0.9 µm. which agrees with the lateral index-confinement size. Therefore, in the cavity normal direction, the spontaneous coupling for the high Q d=2 µm device (FIG. 17, dotted curve) occurs only to the lowest order mode of the cavity due to higher order transverse mode inhibition, while for the high Q d=12 µm device (FIG. 17, dotted curve) the existence of higher order transverse modes broadens the far-field. For the low Q d=2 µm device, the far-field (FIG. 17, solid curve) is modulated as compared to the d=12 µm (solid curve), showing the onset of inhibition of the higher order transverse modes due to index-confinement. The spontaneous coupling efficiencies of FIG. 17 (Δθ=60°) are 5.0% for the low Q d=12 µm, 5.1% for the low Q d=2 µm, 3.0% for the Q d=12 µm, and 3.0% for the high Q d=2 µm devices. Taking the high Q modes for example, the 3.0% spontaneous coupling for the d=2 µm device is predominantly to the lowest order transverse cavity mode, while the 3.0% coupling for the d=12 µm device includes the higher order transverse modes which broaden the far-field (Deppe et al., 1995).

Figure 18:
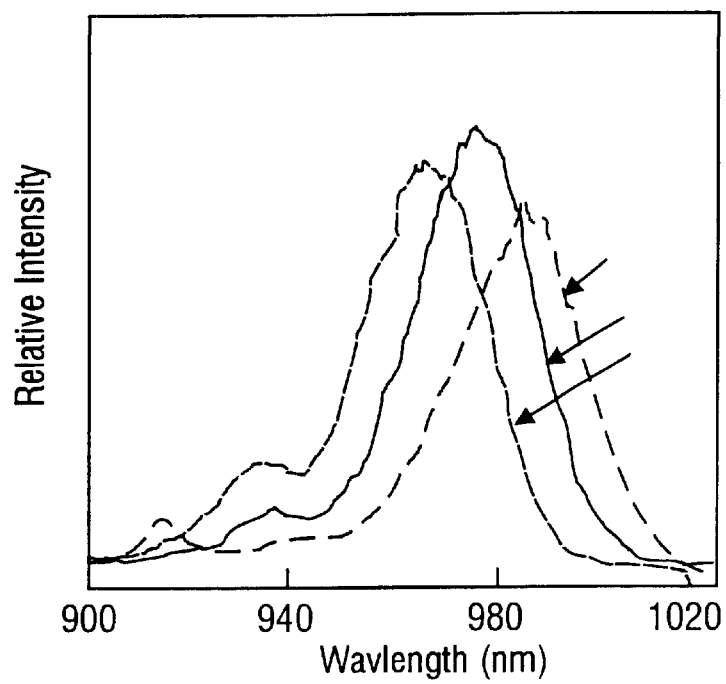
FIG. 18. Spectral tuning with temperature of the low Q. quasi-mode. 0 pairs ZnSe/CaF, d=12 μm microcavity. 320K: ΔA=312 Å, 260K: Δλ=288 Å, 210K: Δλ=302 Å, J=820 A/cm$^2$. Left peak=210K, center peak=260K, right peak=320K.
Figure 19:
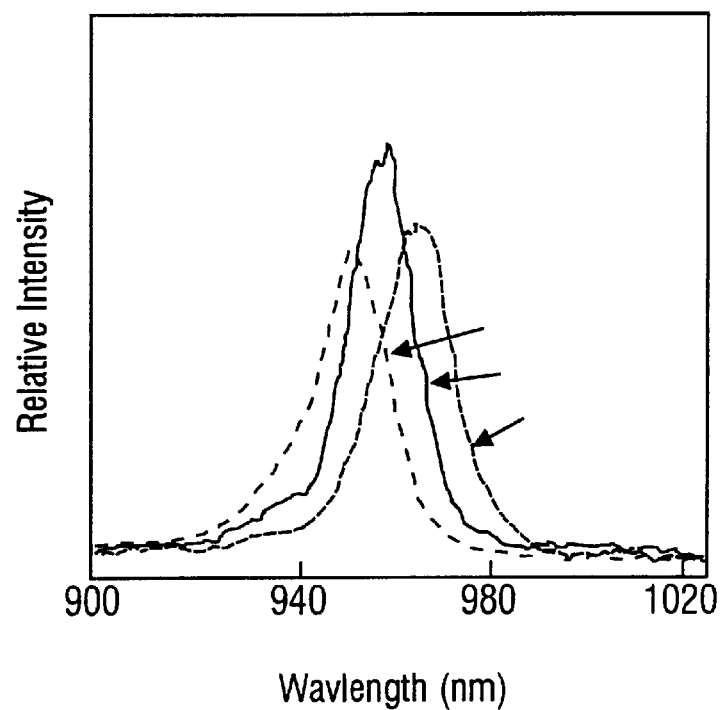
FIG. 19. Spectral tuning with temperature of the low Q, quasi-mode, 0 pairs ZnSe/CaF, d=2 μm microcavity. 250K: Δλ=192Å, 210K: Δλ=160Å, 180K: Δλ=168 Å. J=820 A/cm$^2$. Left peak=180K, center peak=210K, right peak=250K.

The effect of spectral tuning on the spontaneous coupling efficiency is measured by mounting the devices on a temperature controlled dewar stage. The temperature tuning is used to move the quantum well emission peak in and out of resonance with the cavity quasi-mode. To achieve adequate signal power, this setup requires a higher current density which results in increased bandfilling, but the effect of lateral confinement and quasi-mode Q is still significant. The collection half angle into a fiber bundle for the spectral measurement is Δθ=1.3°. The current density is fixed at J=820A/cm$^2$ for both device sizes. The effect of planar microcavity tuning on spontaneous emission with a broadened line width is by now well known (Deppe and Lei. 1992; Deppe et al., 1994; Huffaker et al., 1992), and FIG. 18 shows that for the d=12 µm low Q quasi-mode tuning occurs at a temperature of 260K. Considering the full-width at half-maxima of 312A at 320K, 288A at 260K, and 302A at 210K, the spectrally integrated intensity change over this range of temperature is less than 15%. FIG. 19 shows similar measurements for the low Q index-confined mode of the 2 µm device, which is tuned at 210K. The spectrally integrated intensity change from the tuned temperature of 210K to 180K is 30%, and as for the low Q d=12 µm device this change is not too large. The d=2 µm device shows a reduced spectral width as compared to the d=12 µm device due to the inhibition of the frequency dependent higher order transverse modes (Huffaker and Shin et al., 1995; Huffaker and Deppe et al., 1995; Deppe et al., 1995).

Figure 20:
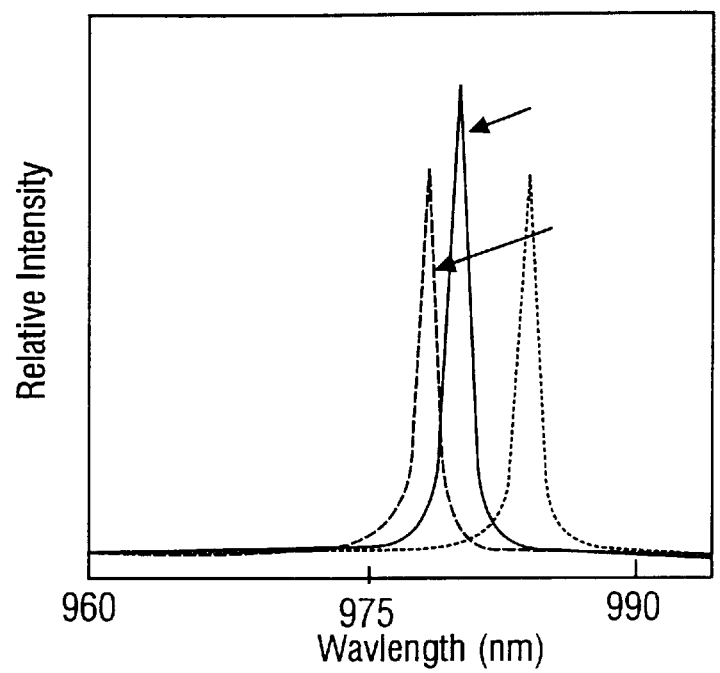
FIG. 20. Spectral tuning with temperature of the high Q, quasi-mode, 3 pairs ZnSe/CaF, d=12 μm microcavity. 320K: Δλ=10Å, 260K: Δλ=10Å, 230K: Δλ=11 Å, J=820 A/cm$^2$. Left peak=230K, center peak=260K, right peak=320K.
Figure 21:
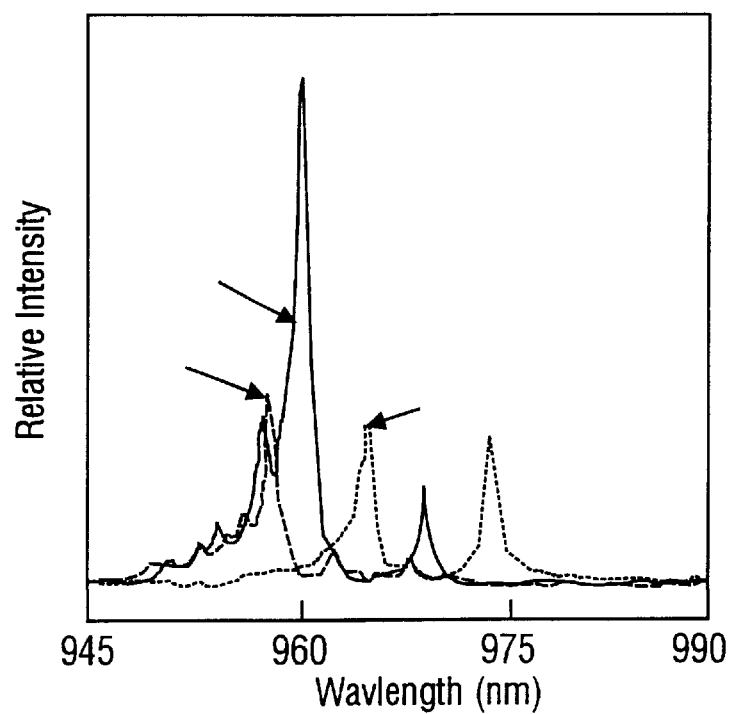
FIG. 21. Spectral tuning with temperature of the high Q. quasi-mode. 3 pairs ZnSe/CaF, d=2 μm microcavity. 270K: Δλ=15Å, 200K: Δλ=11 Å, 180K: Δλ=11 Å, J=820 A/cm$^2$. Left peak=180K, center peak=200K, right peak=270K.

In FIG. 20 is shown the spectral tuning for the high Q mode of the d=12 µm device for the same current density and collection angle. Even for the high Q d=12 µm quasi-mode, the spectrally integrated intensity change due to tuning is still less than 20% for the measured temperature range. FIG. 21 shows the spectral tuning for the high Q mode of the d=2 µm device. Weakly excited higher order transverse modes are observed due to band filling. From a spectral measurement versus collection angle, it is determined that the sharply peaked mode at λ=9600A at 200K corresponds to the lowest order transverse mode of the oxidized cavity. The longer wavelength mode at λ=9750A at 270K appears to be a higher order transverse mode corresponding to the lower unoxidized region of the half-wave cavity spacer. The high Q d=2 μm lowest order quasi-mode intensity changes by a factor of ~2.8 for temperature detuning from 200K to 180K (ΔT=20K). Compared to the intensity change of a factor of ~1.2 for the d=12 μm cavity over a similar ΔT=30K (260K to 230K, FIG. 20), the d=2 μm device exhibits a much greater coupling dependence on cavity tuning.

EXAMPLE 5

Figure 22:
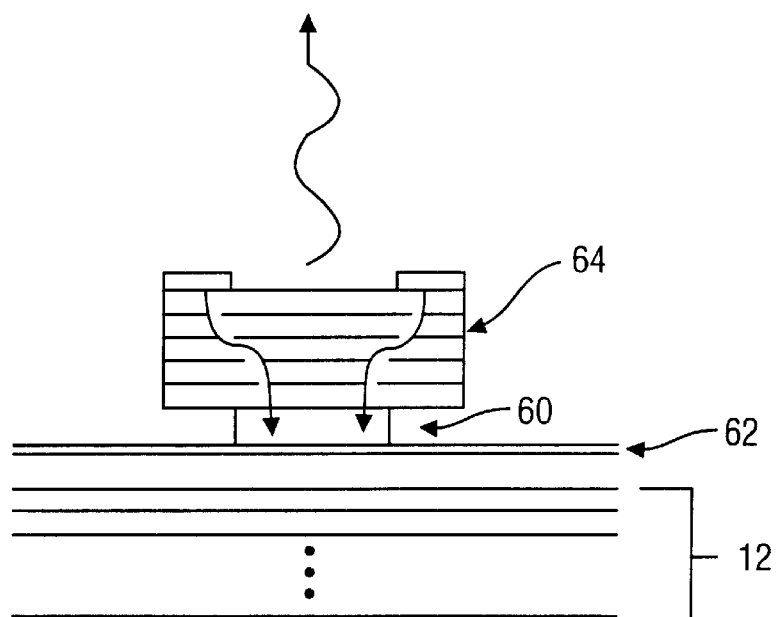
FIG. 22. Schematic cross section illustrating the index confined vertical cavity emitter in which the index confining layer is an etched void.

An index confined VCSEL fabricated with the use of an etched void in the spacer region is shown in FIG. 22. This device is similar to that shown in FIG. 1, except that the native oxide is replaced by an etched and sealed void region for confinement 60, in which unprotected AlAs layers are etched selectively against GaAs layers. A suitable selective etch is 1:1 HCl:$H_2O$. The etching can be performed in two steps. First, vertical sidewalls are etched through existing upper p-type AlAs/GaAs, mirror layers down to the first upper GaAs p-type layer of the mirror. The exposed AlAs layers are then sealed through RTA at 500 to 600° C. The remaining GaAs layer of ~700 Å is then selectively etched to expose the upper p-type AlAs cavity spacer layer. The exposed layer is then etched in a selective HCl:$H_2O$ etch which leaves the QW active region 62 intact along with the barrier layers. Surface recombination of minority carriers is therefore minimized. A second RTA seals the exposed AlAs sidewall 64 of the cavity spacer to prevent oxidation decomposition. Final processing comprises metallization and deposition of any additional upper DBR layers.

Figure 23:
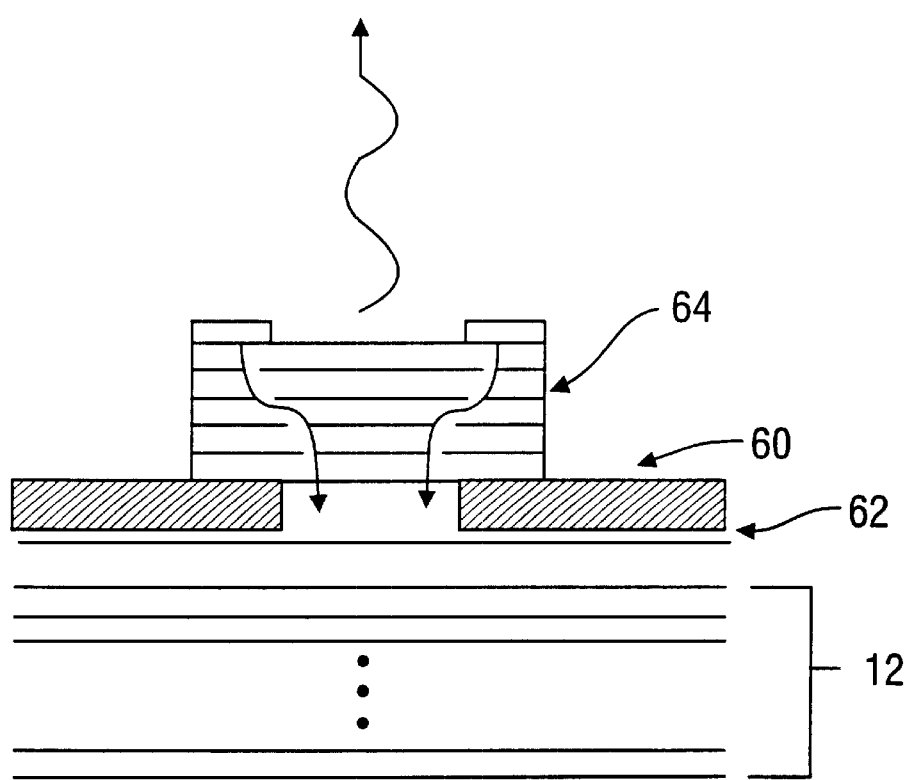
FIG. 23. Schematic cross section illustrating the index confined vertical cavity emitter in which the index confining layer is a native oxide and the upper AlAs layers of the Bragg reflector are sealed through a RTA oxide.

FIG. 23 is a schematic of a device in which the native $Al_xO_y$ 66 is used in combination with the RTA sealing of the AlAs sidewalls to achieve selective conversion only within the cavity spacer. The first etch using reactive ion etching to achieve vertical sidewalls and RTA seal is identical to FIG. 22. In this embodiment, however, the RTA surface oxide is used to mask a subsequent wet oxidation carried out in the temperature range of 400 to 500° C. in a steam ambient so that the $Al_xO_y$ is again formed only within the cavity spacer layer.

EXAMPLE 6

Figure 24:
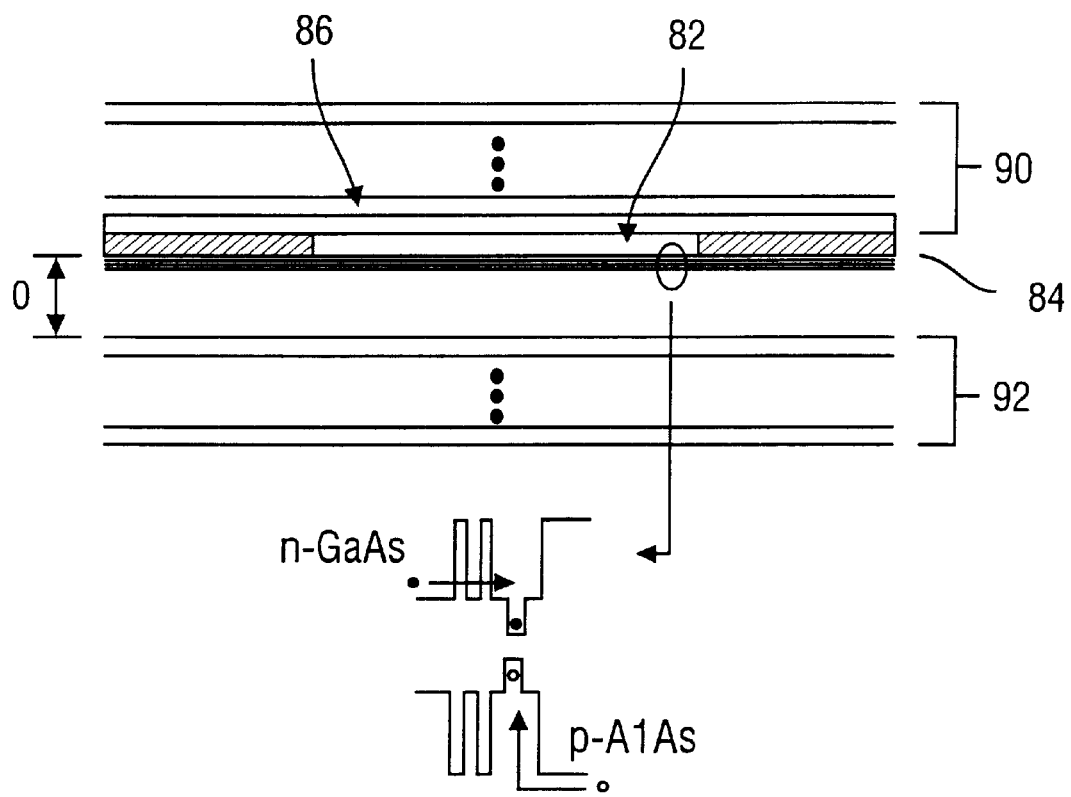
FIG. 24 Schematic cross section illustrating the index confined vertical cavity emitter in which the QW emitting region is placed in a high index GaAs cavity spacer including an adjacent low index AlAs layer to be oxidized. Carrier confinement to the QW emitting region is due to tunnel barrier confinement.

An index confined VCSEL fabricated with the QW emitting region placed at the edge of the cavity spacer is shown in FIG. 24. This device is similar to that of FIG. 1, with an upper DBR 90 and lower DBR 92, except that the cavity spacer now includes a ½ wavelength (or single wavelength) thick high index layer 80 of GaAs 86 along with a ~¼ wave thick low index layer of AlAs 82. Part of the AlAs layer is oxidized 84 to achieve lateral index confinement. The QW emitting region is placed next to the low index AlAs layer to achieve maximum optical confinement. Unique to this device scheme is carrier confinement to the QW region which is achieved using one to two thin layers of AlGaAs (less than or ~50 Å) on the electron side. The thin layers allow injection of electrons through the barriers based on tunneling, while adequately confining hole carriers due to the larger valence band discontinuity and heavier hole masses. The advantage of such a structure is that material quality just prior to deposition of the QW is improved by growing the GaAs layer, while still allowing the index confining layer to be placed effectively within the cavity spacer adjacent to the QW emitting region. The oxide confining layer can also be replaced with the etched void, as in FIG. 22 and Example 5.

While the compositions and methods of this invention have been described in terms of preferred embodiments, it will be apparent to those of skill in the art that variations may be applied to the composition, methods and in the steps or in the sequence of steps of the method described herein without departing from the concept, spirit and scope of the invention. More specifically, it will be apparent that certain agents which are both chemically and physically related may be substituted for the agents described herein while the same or similar results would be achieved. All such similar substitutes and modifications apparent to those skilled in the art are deemed to be within the spirit, scope and concept of the invention as defined by the appended claims.

REFERENCES

The following references, to the extent that they provide exemplary procedural or other details supplementary to those set forth herein, are specifically incorporated herein by reference.

Bjork, G., H. Heitmann, and Y. Yamamoto, Phys. Rev. A 47, 4451 (1993).

Choquette, K. D., K. L. Lear, R. P. Schneider, Jr., and K. M. Geib, "Cavity characteristics of selectively oxidized vertical-cavity lasers," *Appl. Phys. Lett.*, vol. 66, pp. 3413–3415, 1995.

Choquette, K. D., R. P. Schneider, Jr., K. L. Lear, and K. M. Geib, Electron. Lett. 30. 2043 (1994).

Dallesasse, J. M., N. Holonyak, Jr., A. R. Sugg, T. A. Richard, and N. El-Zein, Appl. Phys. Lett. 57, 2844 (1990).

Dallesasse, J. M., N. El-Zein, N. Holonyak. Jr., K. C. Hsieh. R. D. Burnham, and R. D. Dupuis. J. Appl. Phys. 68. 2235 (1990).

DeMartini et al., Phys. Rev. A, 43:2480, 1991.

DeMartini, F., M. Marrocco, and D. Mura, Phys. Rev. Lett. 65, 1853 (1990).

DeNeve et al., *IEEE Phot. Tech. Lett.*, 7:287, 1995.

Deng, H., C. C. Lin, D. L. Huffaker, Q. Deng, D. G. Deppe, and T. J. Rogers, "Temperature dependence of the transverse lasing mode in vertical-cavity lasers," *J. Appl. Phys.*, vol. 77, pp. 2279–2286, 1995.

Deppe et al., *IEEE Phot. Tech. Lett.*, 7:MS#3624, September, 1995.

Deppe et al., *J. Mod. Opt.*, 41:325, 1994.

DEPPE, D. G., HUFFAKER, DENG, H., and LIN. C. C.: 'Low Threshold Vertical-Cavity Lasers Based on Native-Oxidation of AlAs and Their Transverse Mode Structure', Engineering Foundation Conference on High Speed Optoelectronic Devices for Communications and Interconnects, August 14–18 1994. San Luis Obispo Deppe and Lei, *Appl. Phys. Lett.*, 60:527, 1992.

Deppe, *Appl. Phys. Lett.*, 57:1721, 1990.

Deppe et al., *Electron. Lett.*, 26:1665, 1990.

Drexhage, in *Progress in Optics*, edited by E. Wolf (North-Holland, Amsterdam, 1974) pp. 163–232.

Garbuzov, D. Z., N. I. Katsavets, A. V. Kochergin, and V. B. Khalfin, in Joint Soviet-American Workshop on the Physics of Semiconductor Lasers—AIP Conference Proceedings, Z. I. Alferov, ed. (American Institute of Physics, Leningrad, 1992) pp. 6–13.

Hahn, K. H., M. R. Tan, and S. Y. Wang, Electron. Lett. 30, 139 (1994).

Hahn, K. H., M. R. Tan, Y. M. Houng, and S. Y. Wang, Electron. Lett. 29, 1482 (1993).

Hayashi et al., *Electron. Lett.*, 31:560, 1995.

Huffaker and Deppe et al., *Appl. Phys. lett.*, 67:4, 1995.

Huffaker and Shin et al., *Appl. Phys. Lett.*, 66:1723, 1995.

Huffaker and Lin et al., *Appl. Phys. Lett.*, 66:3096, 1995.

HUFFAKER, D. L., DEPPE, D. G., KUMAR, K., and ROGERS, T. J.: 'Native-oxide defined ring contact for low threshold vertical-cavity lasers', *Appl. Phys. Lett.*, 1994, 65, pp. 97–99

Huffaker, D. L., J. Shin, and D. G. Deppe, Appl. Phys. Lett. 65, (Nov. 21, 1994).

Huffaker, D. L., J. Shin. H. Deng, C. C. Lin. D. G. Deppe, and B. G. Streetman. "Improved mode stability in low threshold single quantum well native-oxide defined vertical-cavity lasers." *Appl. Phys. Lett.*, vol. 65, pp. 2642–2644, 1994.

Huffaker, D. L., D. G. Deppe, K. Kumar, and T. J. Rogers, "Native-oxide defined ring contact for low threshold vertical-cavity lasers." Appl. Phys. Lett., vol. 64, pp. 97–99, 1994.

Huffaker, D. L., C. C. Lin, D. G. Deppe, B. G. Streetman, and T. J. Rogers. IEEE Phot. Tech. Lett. 6, 135 (1994).

Huffaker et al., *Appl. Phys. Lett.*, 60:3203, 1992.

Jewell, J. L., J. P. Harbison, A. Scherer, Y. H. Lee, and L. T. Florez, IEEE J. Quant. Electron. 27, 1332 (1991).

Kaneko, Y., T. Tamanuki. M. Katoh, H. Maekawa, F. Koyama, and K. Iga, Jpn. J. Appl. Phys. 32, L1612 (1993).

Krames, M. R., A. D. Minervini, and N. Holonyak, Jr., "Deep-oxide curved resonator for low-threshold AlGaAs-GaAs quantum well heterostructure ring lasers," *Appl. Phys. Lett.*, vol. 67, pp. 73–75, 1995.

Lear. K. L., K. D. Choquette. R. P. Schneider. Jr., S. P. Kilcoyne, and K. M. Geib, "Selectively oxidized vertical cavity surface emitting lasers with 50% power conversion efficiency," *Electron. Lett.*, vol. 31. pp. 208–209, 1995.

Lear. K. L., K. D. Choquette. R. P. Schneider. Jr., and S. P. Kilcoyne. "Modal analysis of a small surface emitting laser with a selectively oxidized waveguide," Appl. Phys. Lett., vol. 66. pp. 2616–2618, 1995.

LEI, C., ROGERS, T. J., DEPPE, D. G., STREETMAN, B. G.: 'ZnSe/CaF$_2$ quarter-wave Bragg reflector for the vertical-cavity surface-emitting laser', *Appl. Phys. Lett.*, 1991, 69, pp. 7430–7433

Lin, C. C., D. G. Deppe, and C. Lei, IEEE J. Quant. Electron. 30, 2304 (1994).

Liu H., B. Zhang, D. Wang, and W. Chen. Appl. Phys. Lett. 38, 557 (1981).

MARANOWSKI, S. A., SUGG, A. R., CHEN, E. I., and HOLONYAK, N. Jr.: 'Native oxide top-and bottom-confined narrow stripe p-n $Al_yGa_{1-y}As$-$GaAs$-$In_xGa_{1-x}As$ quantum well heterostructure laser', *Appl. Phys. Lett.*, 1993, 63, 1660–1662

Numai, T., T. Kawakami, T. Yoshikawa, M. Sugimoto, Y. Sugimoto, H. Yokoyama, K., Kasahara and K. Asakawa, Jpn. J. Appl. Phys. 32, L1533 (1993).

Osuse M. and K. Ujihara. "Spontaneous emission and oscillation in a planar microcavity dye laser," *J. Appl. Phys.*, vol. 76, pp. 2588–2597, 1994.

Richard, T. A., N. Holonyak, Jr., F. A. Kish, M. R. Keever, and C. Lei, Appl. Phys. Lett. 66, 2972 (1995).

Rogers. T. J., D. L. Huffaker. H. Deng, Q. Deng, and D. G. Deppe, IEEE Phot. Tech. Lett. 7, 238 (1995).

Sugg et al., *Appl. Phys. Lett.*, 62:1259, 1993.

Tsang, W. T., Appl. Phys. Lett. 33,426 (1978).

Ujihara, K., Jpn. J. Appl. Phys. 30, L901 (1991).

Yamamoto, Y., S. Machida, K. Igeta, and G. Bjork, *Coherence, Amplification, and Quantum Effects in Semiconductor Lasers* (John Wiley, New York, 1991) Chap. 13.

Yang et al., *Electron. Lett.*, 31:886, 1995.

What is claimed is:

1. A semiconductor device having an exposed AlAs or AlGaAs surface sealed by an oxide formed by a rapid thermal anneal in a dry inert gas containing dry oxygen.

2. The semiconductor device of claim 1, wherein said rapid temperature anneal is performed at a temperature of from about 400 to about 1,000° C.

3. The semiconductor device of claim 1, wherein said rapid temperature anneal is performed at a temperature of from about 500 to about 600° C.

4. The semiconductor device of claim 1, wherein said rapid temperature anneal is performed at a temperature of from about 525 to about 550° C.

5. The semiconductor device of claim 1, wherein said rapid temperature anneal is performed for a period of from about 5 seconds to about 10 minutes.

6. The semiconductor device of claim 1, wherein said rapid temperature anneal is performed for a period of from about 5 seconds to about 1 minute.

7. The semiconductor device of claim 1, wherein said rapid temperature anneal is performed for a period of from about 15 seconds to about 45 seconds.

8. A method of sealing an AlAs layer against oxidative decomposition comprising contacting said layer with a dense surface oxide formed by annealing in a dry inert gas ambient containing dry oxygen at a temperature of from about 400 to about 1000° C. for a time sufficient to seal said AlAs layer.

9. The method of claim 8, wherein said time is from about 5 seconds to about 5 minutes.

10. The method of claim 8, wherein said dry inert gas is nitrogen, a combination of nitrogen and hydrogen, argon or a combination of argon and hydrogen.

11. The method of claim 9, wherein said hydrogen is present at about 10% v/v.

* * * * *